(12) United States Patent
Fukuzawa et al.

(10) Patent No.: US 7,804,432 B2
(45) Date of Patent: Sep. 28, 2010

(54) INTEGRATED CIRCUIT DEVICE AND ELECTRONIC INSTRUMENT

(75) Inventors: Akihiro Fukuzawa, Hino (JP); Nobuyuki Imai, Shiojiri (JP); Satoru Ito, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 12/389,782

(22) Filed: Feb. 20, 2009

(65) Prior Publication Data

US 2009/0212983 A1 Aug. 27, 2009

(30) Foreign Application Priority Data

Feb. 21, 2008 (JP) .............................. 2008-040437

(51) Int. Cl.
*H03M 1/06* (2006.01)
(52) U.S. Cl. .................. 341/118; 330/181; 330/284
(58) Field of Classification Search ......... 341/118–155; 330/181, 284
See application file for complete search history.

(56) References Cited

U.S. PATENT DOCUMENTS

| 7,085,587 | B2 | 8/2006 | Oono et al. | |
|---|---|---|---|---|
| 7,088,278 | B2 * | 8/2006 | Kurose et al. | 341/155 |
| 7,236,118 | B2 * | 6/2007 | Kurose et al. | 341/161 |
| 7,250,895 | B2 * | 7/2007 | Kurose et al. | 341/155 |
| 7,257,385 | B2 | 8/2007 | Ono et al. | |
| 2005/0062855 | A1 | 3/2005 | Tani et al. | |
| 2007/0202813 | A1 | 8/2007 | Ono et al. | |
| 2007/0202814 | A1 | 8/2007 | Ono et al. | |

FOREIGN PATENT DOCUMENTS

| JP | A-4-185018 | 7/1992 |
|---|---|---|
| JP | A-2002-217762 | 8/2002 |
| JP | A-2005-101870 | 4/2005 |
| JP | A-2005-110080 | 4/2005 |
| JP | A-2007-117586 | 5/2007 |
| JP | A-2007-285745 | 11/2007 |

OTHER PUBLICATIONS

New U.S. Patent Application filed on Feb. 20, 2009 in the name of Fukuzawa et al.
U.S. Appl. No. 12/338,547, filed Dec. 18, 2008, Fukuzawa et al.
U.S. Appl. No. 12/343,796, filed Dec. 24, 2008, Fukuzawa et al.

* cited by examiner

*Primary Examiner*—Lam T Mai
(74) *Attorney, Agent, or Firm*—Oliff & Berridge, PLC

(57) ABSTRACT

An integrated circuit device includes an amplifier circuit that includes first to Nth amplifiers, an A/D converter, first to Nth offset adjustment registers that are provided corresponding to the first to Nth amplifiers and store first to Nth offset adjustment data, first to Nth D/A converters provided corresponding to the first to Nth amplifiers, first to Nth offset value storage sections that store first to Nth offset value data, and a control circuit that calculates the first to Nth offset adjustment data based on the first to Nth offset value data, and sets the first to Nth offset adjustment data in the first to Nth offset adjustment registers.

16 Claims, 17 Drawing Sheets

$$VQ = -\frac{R2}{R1}(Vin+VD)$$

$$VQ = \frac{R2}{R1}(VD-Vin)$$

$$VQ = -\frac{R2}{R1}Vin + \left(1+\frac{R2}{R1}\right)VD$$

FIG. 3
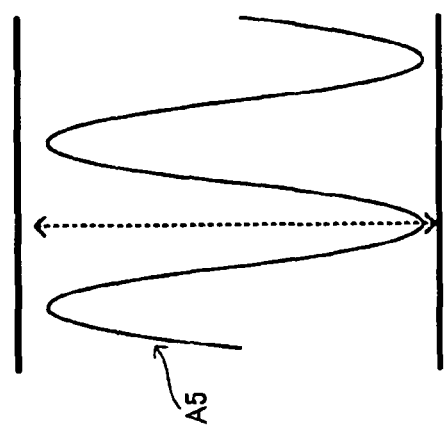
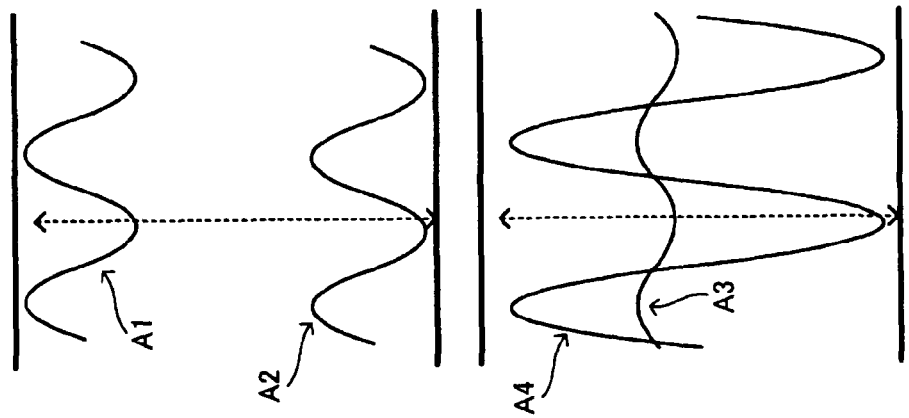

FIG. 9A
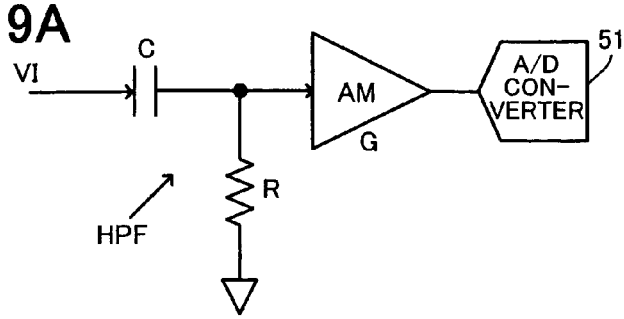
FIG. 9B
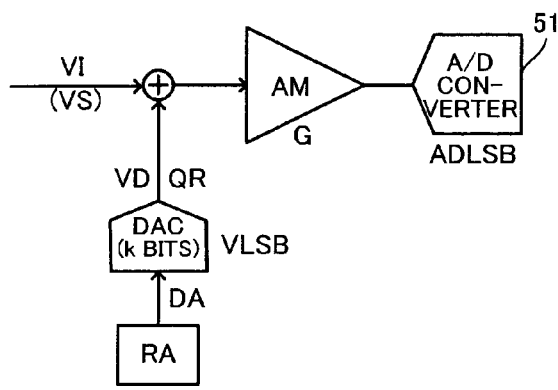
FIG. 9C
| | HPF | SINGLE-STAGE AMPLIFIER/SINGLE-STAGE DAC | MULTI-STAGE AMPLIFIER/MULTI-STAGE DAC |
|---|---|---|---|
| CALIBRATION RESPONSE SPEED | × | ○ | ○ |
| SIZE | × | × | ○ |
| ACCURACY | ○ | × | ○ |
FIG. 9D
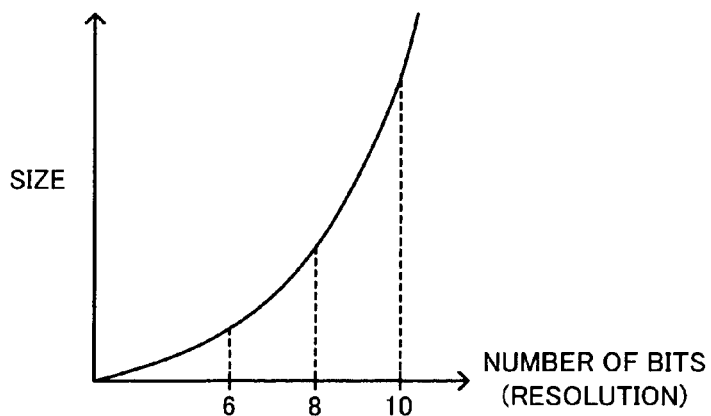

FIG. 10A  SINGLE-STAGE AMPLIFIER/SINGLE-STAGE DAC

| RESOLUTION (NUMBER OF BITS) | OUTPUT RANGE | DAC ACCURACY (1LSB-EQUIVALENT VOLTAGE) |
|---|---|---|
| 15 BITS | 3V | 93.75 μV |

FIG. 10B

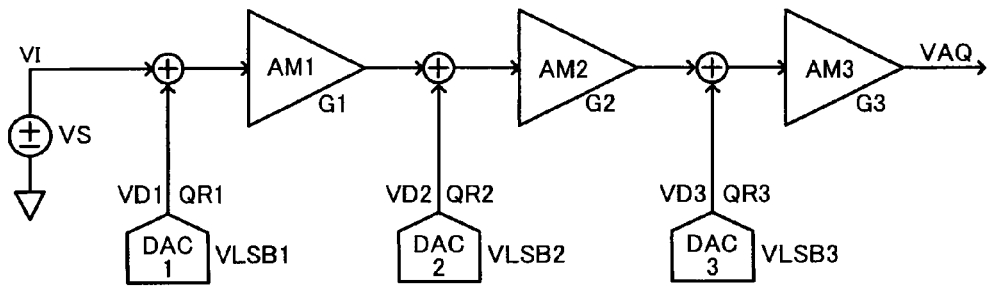

$VAQ = G1 \times G2 \times G3 \times VS + G1 \times G2 \times G3 \times VD1 + G2 \times G3 \times VD2 + G3 \times VD3$ $VS = -\left(VD1 + \dfrac{VD2}{G1} + \dfrac{VD3}{G1 \times G2}\right)$

FIG. 10C  MULTI-STAGE AMPLIFIER/MULTI-STAGE DAC

| DAC | RESOLUTION (NUMBER OF BITS) | OUTPUT RANGE | DAC ACCURACY (1LSB-EQUIVALENT VOLTAGE) |
|---|---|---|---|
| DAC1 | 5 | 3V (QR1) | 96mV (VLSB1) |
| DAC2 | 5 | 0.384V (QR2) | 12mV (VLSB2) |
| DAC3 | 5 | 48mV (QR3) | 1.5mV (VLSB3) |

G1=4, G2=4, G3=2

QR1 > QR2 > QR3

VLSB1 > VLSB2 > VLSB3

INTEGRATED CIRCUIT DEVICE AND ELECTRONIC INSTRUMENT

Japanese Patent Application No. 2008-40437 filed on Feb. 21, 2008, is hereby incorporated by reference in its entirety.

BACKGROUND

The present invention relates to an integrated circuit device, an electronic instrument, and the like.

In order to implement a ubiquitous network society, a sensor network that is formed by connecting a plurality of sensors through a network and acquires information from each sensor to comprehensively determine the situation is necessary. Such a sensor network utilizes various sensors such as a temperature sensor, a smoke sensor, an optical sensor, a human detection sensor, a pressure sensor, a biosensor, and a gyrosensor. A sensor detection signal varies in amplitude, DC offset, frequency band, and the like corresponding to the type of sensor.

Since the sensor detection signal (sensor signal) is an analog signal, the analog sensor detection signal must be converted into digital data in order to analyze and determine information using a CPU or the like. For example, JP-A-2007-117586 and JP-A-2007-285745 disclose A/D converters that convert an analog detection signal output from a sensor into digital data.

However, an integrated circuit device (IC) that includes such an A/D converter has been generally developed as a sensor-specific integrated circuit device. Therefore, when a new sensor has been developed, an integrated circuit device for the new sensor must be developed and produced by way of trial. This process is very expensive. In this case, a general-purpose integrated circuit device may be used. However, since a sensor detection signal varies in amplitude and DC offset corresponding to the type of sensor, it is substantially impossible to deal with a new sensor using a general-purpose integrated circuit device. Therefore, the user cannot easily produce an integrated circuit device for various sensors by way of trial.

In order to deal with various sensors, it is desirable to arbitrarily adjust the offset and the gain of a sensor detection signal that varies in amplitude and DC offset corresponding to the type of sensor.

However, when implementing such an offset adjustment and the like using a single-stage amplifier and a single-stage D/A converter provided corresponding to the single-stage amplifier, an increase in the size of the D/A converter, a decrease in response speed, or the like may occur.

SUMMARY

According to one aspect of the invention, there is provided an integrated circuit device comprising:

an amplifier circuit that includes first to Nth (N is an integer equal to or larger than two) amplifiers and receives an input signal, the first to Nth amplifiers being cascaded;

an A/D converter that performs an A/D conversion process on a signal amplified by the amplifier circuit;

first to Nth offset adjustment registers that are provided corresponding to the first to Nth amplifiers and store first to Nth offset adjustment data, the first to Nth offset adjustment data being used to perform an offset adjustment of the first to Nth amplifiers;

first to Nth D/A converters that are provided corresponding to the first to Nth amplifiers and used to perform an offset adjustment based on the first to Nth offset adjustment data;

first to Nth offset value storage sections that store first to Nth offset value data, the first to Nth offset value data being offset value data of the first to Nth amplifiers; and a control circuit that calculates the first to Nth offset adjustment data based on the first to Nth offset value data stored in the first to Nth offset value storage sections, and sets the first to Nth offset adjustment data in the first to Nth offset adjustment registers.

According to another aspect of the invention, there is provided an electronic instrument comprising the above integrated circuit device.

BRIEF DESCRIPTION OF THE DRAWINGS

FIG. 3 is a view illustrative of a method that increases the A/D conversion dynamic range.

FIGS. 9A to 9D are views illustrative of the advantages of a multi-stage amplifier/multi-stage DAC configuration.

FIGS. 10A to 10C are views illustrative of the advantages of a multi-stage amplifier/multi-stage DAC configuration.

DESCRIPTION OF EXEMPLARY EMBODIMENTS

Figure 1:
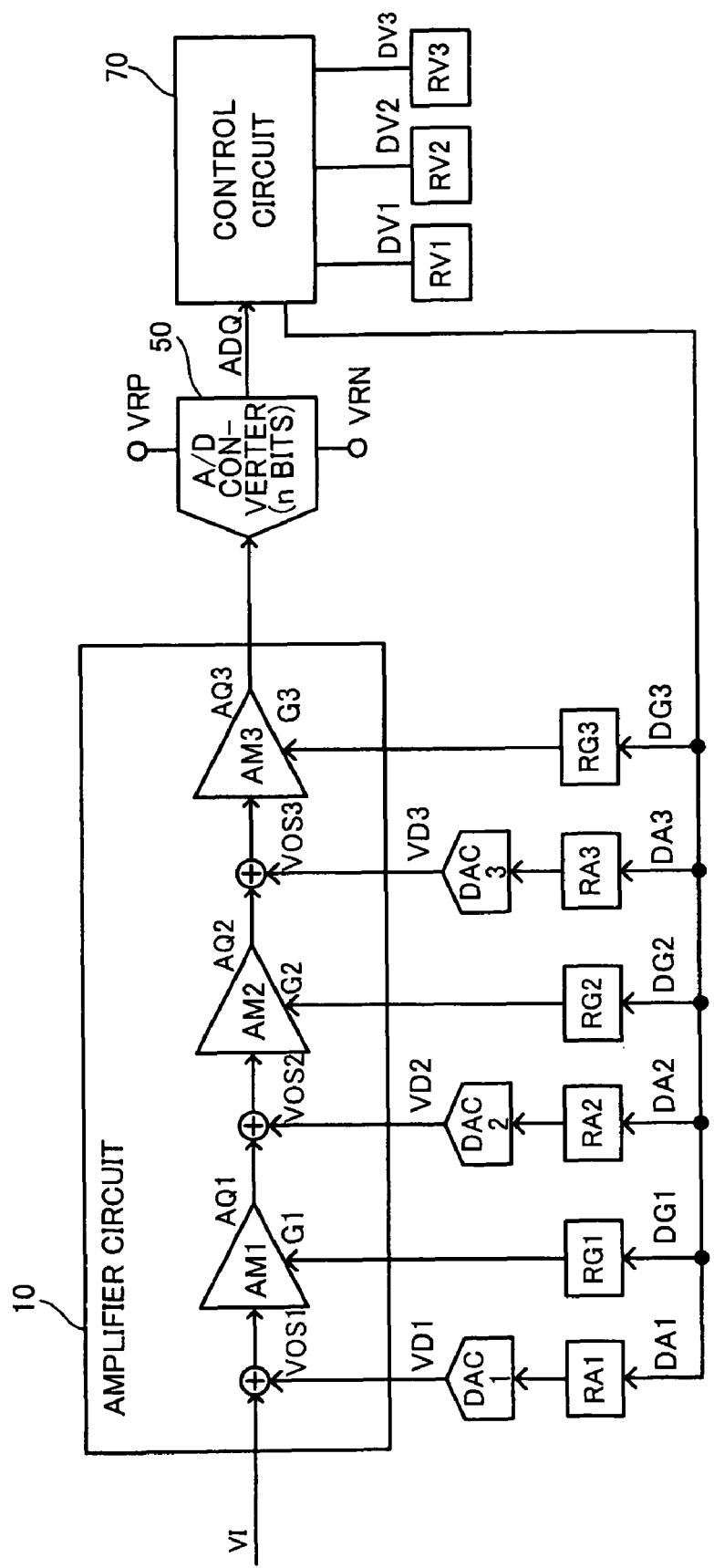
FIG. 1 shows a configuration example of an integrated circuit device according to one embodiment of the invention.

Several aspects of the invention may provide an integrated circuit device that implements an accurate offset adjustment and the like while suppressing an increase in circuit scale, an electronic instrument including the same, and the like.

According to one embodiment of the invention, there is provided an integrated circuit device comprising:

an amplifier circuit that includes first to Nth (N is an integer equal to or larger than two) amplifiers and receives an input signal, the first to Nth amplifiers being cascaded;

an A/D converter that performs an A/D conversion process on a signal amplified by the amplifier circuit;

first to Nth offset adjustment registers that are provided corresponding to the first to Nth amplifiers and store first to Nth offset adjustment data, the first to Nth offset adjustment data being used to perform an offset adjustment of the first to Nth amplifiers;

first to Nth D/A converters that are provided corresponding to the first to Nth amplifiers and used to perform an offset adjustment based on the first to Nth offset adjustment data;

first to Nth offset value storage sections that store first to Nth offset value data, the first to Nth offset value data being offset value data of the first to Nth amplifiers; and a control circuit that calculates the first to Nth offset adjustment data based on the first to Nth offset value data stored in the first to Nth offset value storage sections, and sets the first to Nth offset adjustment data in the first to Nth offset adjustment registers.

According to this embodiment, the first to Nth offset adjustment registers and the first to Nth D/A converters are provided corresponding to the first to Nth amplifiers of the amplifier circuit. The first to Nth offset value storage sections that store the first to Nth offset value data of the first to Nth amplifiers are also provided. The control circuit calculates the first to Nth offset adjustment data based on the first to Nth offset value data stored in the first to Nth offset value storage sections, and sets the first to Nth offset adjustment data in the first to Nth offset adjustment registers. The first to Nth D/A converters perform an offset adjustment of the first to Nth amplifiers based on the first to Nth offset value data set in the first to Nth offset value storage sections. Specifically, this embodiment implements an offset adjustment and the like by utilizing the multi-stage amplifier/multi-stage DAC configuration. Therefore, an accurate offset adjustment and the like can be implemented while suppressing an increase in circuit scale as compared with the case of using a single-stage amplifier/single-stage DAC configuration.

In the integrated circuit device may further comprise:

first to Nth gain adjustment registers that are provided corresponding to the first to Nth amplifiers and store first to Nth gain adjustment data, the first to Nth gain adjustment data being used to perform a gain adjustment of the first to Nth amplifiers.

This makes it possible to implement a gain adjustment corresponding to the amplitude of the input signal, for example. Moreover, the gain of each of the first to Nth amplifiers can be set individually.

In the integrated circuit device, the control circuit may calculate the first to Nth offset value data based on digital data from the A/D converter and gains of the first to Nth amplifiers, and may set the first to Nth offset value data in the first to Nth offset value storage sections when performing amplifier offset calibration of the first to Nth amplifiers.

According to this configuration, offset calibration that calculates the first to Nth offset value data that corresponds to the offset voltages of the first to Nth amplifiers can be performed while setting the gains of the first to Nth amplifiers at various values. Therefore, the measurement accuracy of offset calibration can be improved, for example.

In the integrated circuit device, the control circuit may perform jth (j is an integer that satisfies $1<j\leq N$) offset calibration that measures an offset voltage of a jth amplifier among the first to Nth amplifiers, then may perform (j−1)th offset calibration that measures an offset voltage of a (j−1)th amplifier among the first to Nth amplifiers that is provided in a preceding stage of the jth amplifier when performing amplifier offset calibration of the first to Nth amplifiers.

An efficient offset calibration can be implemented by performing offset calibration in the order from the subsequent-stage amplifier among the first to Nth amplifiers.

In the integrated circuit device, the control circuit may perform jth (j is an integer that satisfies $1<j\leq N$) offset calibration that measures an offset voltage of a jth amplifier among the first to Nth amplifiers, during the jth offset calibration the control circuit may calculate a jth offset value data among the first to Nth offset value data based on digital data from the A/D converter and a gain of the jth amplifier, and may set the jth offset value data in a jth offset value storage section among the first to Nth offset value storage sections, and the control circuit may perform (j−1)th offset calibration that measures an offset voltage of a (j−1)th amplifier among the first to Nth amplifiers, during the (j−1)th offset calibration the control circuit may calculate the jth offset adjustment data based on the jth offset value data, may set the jth offset adjustment data in the jth offset adjustment register, may calculate a (j−1)th offset value data among the first to Nth offset value data based on the digital data from the A/D converter, a gain of the (j−1)th amplifier, and the gain of the jth amplifier, and may set the (j−1)th offset value data in a (j−1)th offset value storage section among the first to Nth offset value storage sections.

According to this configuration, the jth offset value data is calculated based on the digital data from the A/D converter and the gain of the jth amplifier when performing jth offset calibration. In (j−1)th offset calibration, the jth offset adjustment data calculated based on the jth offset value data is set in the jth offset adjustment register. The digital data from the A/D converter is monitored in this state so that the (j−1)th offset value data can be calculated based on the monitored digital data, the gain of the (j−1)th amplifier, and the gain of the jth amplifier.

In the integrated circuit device, the control circuit may set the gain of the (j−1)th amplifier and the gain of the jth amplifier so that the gain of the (j−1)th amplifier is higher than the gain of the jth amplifier when performing the (j−1)th offset calibration.

According to this configuration, since the gain of the (j−1)th amplifier subjected to offset calibration increases, the measurement accuracy of the (j−1)th offset value data corresponding to the (j−1)th amplifier can be improved.

In the integrated circuit device, the control circuit may perform (j−2)th offset calibration that measures an offset voltage of a (j−2)th amplifier among the first to Nth amplifiers, during the (j−2)th offset calibration the control circuit may calculate (j−1)th offset adjustment data among the first to Nth offset adjustment data based on the (j−1)th offset value data, may set the (j−1)th offset adjustment data in a (j−1)th offset adjustment register among the first to Nth offset adjustment registers, may calculate jth offset adjustment data among the first to Nth offset adjustment data based on the (j−1)th offset value data and the jth offset value data, may set the jth offset adjustment data in a jth offset adjustment register among the first to Nth offset adjustment registers, may calculate (j−2)th offset value data among the first to Nth offset value data based on the digital data from the A/D converter, a gain of the (j−2)th amplifier, the gain of the (j−1)th amplifier, and the gain of the jth amplifier, and may set the (j−2)th offset value data in a (j−2)th offset value storage section among the first to Nth offset value storage sections.

According to this configuration, when performing the (j−2)th offset calibration, the (j−1)th offset adjustment data calculated based on the (j−1)th offset value data is set in the (j−1)th offset adjustment register, and the jth offset adjustment data calculated based on the (j−1)th offset value data and the jth offset value data is set in the jth offset adjustment register. The digital data from the A/D converter is monitored in this state so that the (j−2)th offset value data can be calculated based on the monitored digital data, the gain of the (j−2)th amplifier, the gain of the (j−1)th amplifier, and the gain of the jth amplifier.

In the integrated circuit device, the control circuit may calculate the jth offset adjustment data based on a rounding error value, the gain of the (j−1)th amplifier, and the jth offset value data, and may set the jth offset adjustment data in the jth offset adjustment register when performing the (j−2)th offset calibration, the rounding error value being due to a rounding calculation process that calculates the (j−1)th offset adjustment data based on the (j−1)th offset value data.

According to this configuration, since the rounding error value due to the rounding calculation process that calculates the (j−1)th offset adjustment data can be reflected in the jth offset adjustment data and set in the jth offset adjustment register, the offset calibration accuracy can be further improved.

In the integrated circuit device, the control circuit may calculate the first to Nth offset adjustment data based on the first to Nth offset value data stored in the first to Nth offset value storage sections, and may set the first to Nth offset adjustment data in the first to Nth offset adjustment registers when performing signal offset calibration of the input signal.

According to this configuration, the first to Nth offset adjustment data can be set using the first to Nth offset value data stored in the first to Nth offset value storage sections. Therefore, signal offset calibration of the input signal can be performed in a state in which the offset voltages of the first to Nth amplifiers are canceled, for example.

In the integrated circuit device, the control circuit may calculate ith (i is an integer that satisfies $1 \leq i-N$) offset adjustment data among the first to Nth offset adjustment data, may set the ith offset adjustment data in an ith offset adjustment register among the first to Nth offset adjustment registers, may calculate (i+1)th offset adjustment data among the first to Nth offset adjustment data, and may set the (i+1)th offset adjustment data in an (i+1)th offset adjustment register among the first to Nth offset adjustment registers when performing the signal offset calibration.

An efficient signal offset calibration can be implemented by performing signal offset calibration in the order from the preceding-stage amplifier among the first to Nth amplifiers.

In the integrated circuit device, the control circuit may calculate ith (i is an integer that satisfies $1 \leq i<N$) offset adjustment data based on ith offset value data among the first to Nth offset value data, may set the ith offset adjustment data in an ith offset adjustment register among the first to Nth offset adjustment registers, the control circuit may calculate (i+1)th offset adjustment data among the first to Nth offset adjustment data based on the ith offset value data, (i+1)th offset value data among the first to Nth offset value data, and a gain of an ith amplifier among the first to Nth amplifiers, and may set (i+1)th offset adjustment data in an (i+1)th offset adjustment register among the first to Nth offset adjustment registers.

According to this configuration, the ith offset adjustment data calculated based on the ith offset value data is set in the ith offset adjustment register, and the (i+1)th offset adjustment data calculated based on the ith offset value data, the (i+1)th offset value data, and the gain of the ith amplifier is set in the (i+1)th offset adjustment register.

In the integrated circuit device, the control circuit may calculate the (i+1)th offset adjustment data based on a rounding error value, the gain of the ith amplifier, and the (i+1)th offset value data, and may set the (i+1)th offset adjustment data in the (i+1)th offset adjustment register, the rounding error value being due to a rounding calculation process that calculates the ith offset adjustment data based on the ith offset value data.

According to this configuration, since the rounding error value due to the rounding calculation process that calculates the ith offset adjustment data can be reflected in the (i+1)th offset adjustment data and set in the (i+1)th offset adjustment register, the signal offset calibration accuracy can be further improved.

In the integrated circuit device, the control circuit may calculate signal offset value data of the input signal based on digital data from the A/D converter and gains of the first to Nth amplifiers after the first to Nth offset adjustment data has been set in the first to Nth offset adjustment registers.

According to this configuration, accurate signal offset value data can be calculated.

In the integrated circuit device, the control circuit may set the gains of the first to Nth amplifiers at gains under a first gain condition, and may calculate signal offset value data of the input signal, the control circuit may set the gains of the first to Nth amplifiers at gains under a second gain condition, and again may calculate the signal offset value data of the input signal, the gains under the second gain condition being set to be higher than the gains under the first gain condition.

The measurement accuracy can be further improved by again measuring the signal offset value data while changing the gain condition.

In the integrated circuit device may further comprise: a determination circuit that determines whether or not a voltage of an output signal from each of the first to Nth amplifiers is within a determination voltage range specified by a high-potential-side determination voltage and a low-potential-side determination voltage, the control circuit may set the gains under the second gain condition based on a determination result of the determination circuit.

According to this configuration, the signal offset value data can be measured again under the second gain condition having an optimum gain setting corresponding to the signal amplitude.

According to another embodiment of the invention, there is provided an electronic instrument comprising one of the above integrated circuit devices.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Integrated Circuit Device

FIG. 1 shows a configuration example of an integrated circuit device according to one embodiment of the invention. The integrated circuit device (analog front-end circuit) includes an amplifier circuit 10, an A/D converter 50, and a control circuit 70. The integrated circuit device also includes D/A converters DAC1 to DAC3, offset adjustment registers RA1 to RA3, gain adjustment registers RG1 to RG3, and offset value storage sections RV1 to RV3. Note that the integrated circuit device according to this embodiment is not limited to the configuration shown in FIG. 1. Various modifications may be made such as omitting some (e.g., offset adjustment register, gain adjustment register, offset value storage section, and control circuit) of the elements or adding other elements (e.g., filter).

The amplifier circuit 10 includes a plurality of amplifiers AM1 to AM3 (first to Nth amplifiers in a broad sense; N is an integer equal to or larger than two). The amplifier circuit 10 receives an input signal VI, and amplifies the input signal VI. The amplifiers AM1 to AM3 are cascaded, for example. Specifically, the amplifier AM1 receives the input signal VI from a sensor or the like, and outputs an output signal AQ1 to the amplifier AM2. The amplifier AM2 receives the output signal AQ1 from the amplifier AM1, and outputs an output signal AQ2 to the amplifier AM3. The amplifier AM3 receives the output signal AQ2 from the amplifier AM2, and outputs an output signal AQ3 to the A/D converter 50, for example. Note that the number of stages of amplifiers included in the amplifier circuit 10 is not limited to three. Various modifications may be made such as changing the number of stages of amplifiers to two or four or more, for example.

The offset adjustment registers RA1 to RA3 (first to Nth offset adjustment registers in a broad sense) are provided corresponding to the amplifiers AM1 to AM3 (first to Nth amplifiers). The offset adjustment registers RA1 to RA3 store offset adjustment data DA1 to DA3 (first to Nth offset adjustment data in a broad sense). The offset adjustment data DA1 to DA3 is offset adjustment data for the amplifiers AM1 to AM3, and is respectively input to the D/A converters DAC1 to DAC3, for example. The offset adjustment registers RA1 to RA3 may be implemented by a flip-flop, a memory (RAM), or the like.

The D/A converters DAC1 to DAC3 (first to Nth D/A converters in a broad sense) are provided corresponding to the amplifiers AM1 to AM3. The D/A converters DAC1 to DAC3 perform an offset adjustment (amplifier offset adjustment or signal offset adjustment) based on the offset adjustment data DA1 to DA3, respectively.

Specifically, the D/A converter DAC1 outputs a voltage VD1 corresponding to the offset adjustment data DA1. An offset adjustment of the amplifier AM1 is implemented by adding the voltage VD1 output from the D/A converter DAC1 to the voltage of the input signal VI. This makes it possible to cancel an offset voltage VOS1 of an operational amplifier of the amplifier AM1, or cancel the DC offset of the input signal VI. Likewise, the D/A converters DAC2 and DAC3 output voltages VD2 and VD3 corresponding to the offset adjustment data DA2 and DA3, respectively. An offset adjustment of the amplifiers AM2 and AM3 is implemented by adding the voltages VD2 and VD3 output from the D/A converters DAC2 and DAC3 to the voltages of the output signals AQ1 and AQ2 from the amplifiers AM1 and AM2, respectively. This makes it possible to cancel offset voltages VOS2 and VOS3 of operational amplifiers of the amplifiers AM2 and AM3, or cancel the DC offset of the input signal VI. A D/A converter using a ladder resistor circuit or the like may be used as the D/A converters DAC1 to DAC3. Specifically, a D/A converter that includes a ladder resistor circuit and an operational amplifier provided in the subsequent stage of the ladder resistor circuit may be used as the D/A converters DAC1 to DAC3.

The gain adjustment registers RG1 to RG3 (first to Nth gain adjustment registers in a broad sense) are provided corresponding to the amplifiers AM1 to AM3. The gain adjustment registers RG1 to RG3 store gain adjustment data DG1 to DG3 (first to Nth gain adjustment data in a broad sense). The gain adjustment data DG1 to DG3 adjusts the gains G1 to G3 of the amplifiers AM1 to AM3. Specifically, the gains G1 to G3 of the amplifiers AM1 to AM3 are adjusted by adjusting the resistances of resistors (element values of passive elements) included in the amplifiers AM1 to AM3 based on the gain adjustment data DG1 to DG3, for example. This makes it possible to implement a gain adjustment corresponding to the amplitude of the input signal VI. The gain adjustment registers RG1 to RG3 may be implemented by a flip-flop, a memory, or the like.

The offset value storage sections RV1 to RV3 (first to Nth offset value storage sections in a broad sense) store offset value data DV1 to DV3 (first to Nth offset value data in a broad sense) that is offset value data relating to the amplifiers AM1 to AM3. The offset value data DV1 to DV3 respectively corresponds to the offset voltages VOS1 to VOS3 of the amplifiers AM1 to AM3, for example. The offset adjustment data DA1 to DA3 may be set based on the offset value data DV1 to DV3, the 1LSB-equivalent voltages of the D/A converters DAC1 to DAC3, and the like, for example.

The offset value storage sections RV1 to RV3 may be implemented by a register formed by a flip-flop, a memory, or the like, or may be implemented by a nonvolatile memory (e.g., EEPROM), a fuse element, or the like.

In FIG. 1, the D/A converters DAC1 to DAC3, the offset adjustment registers RA1 to RA3 the gain adjustment registers RG1 to RG3, and the offset value storage sections RV1 to RV3 are provided corresponding to all of the amplifiers AM1 to AM3 included in the amplifier circuit 10. Note that the D/A converters, the offset adjustment registers, the gain adjustment registers, and the offset value storage sections may be provided corresponding to only some (e.g., two stages) of the amplifiers AM1 to AM3.

The A/D converter 50 performs an A/D conversion process on a signal amplified by the amplifier circuit 10. Specifically, a high-potential-side reference voltage VRP and a low-potential-side reference voltage VRN that specify (set) the input voltage range of the A/D converter 50 are supplied to the A/D converter 50. The A/D converter 50 performs the A/D conversion process at a resolution of n bits (e.g., n=10) in the input voltage range specified by the high-potential-side reference voltage VRP and the low-potential-side reference voltage VRN, and outputs digital data ADQ (digital output value) obtained by the A/D conversion process. For example, the A/D converter 50 samples/holds the signal AQ3 output from the amplifier circuit 10 using an A/D conversion sampling clock signal, and performs the A/D conversion process on the sampled/held signal. Note that a prefilter such as an RC filter or a switched capacitor filter (SCF) may be provided in the preceding stage of the A/D converter 50 (i.e., between the A/D converter and the amplifier circuit).

A successive approximation type A/D converter may be used as the A/D converter 50, for example. In this case, the A/D converter 50 may include a sample-hold circuit, a comparator, a successive approximation register, and a D/A converter (not shown). The comparator compares an analog signal obtained by a D/A conversion process and output from the D/A converter with a sampled/held signal output from the sample-hold circuit. The successive approximation register stores data relating to an output signal from the comparator. The D/A converter performs a D/A conversion process on the digital data output from the successive approximation register, and outputs the resulting analog signal. Note that the A/D converter 50 is not limited to the successive approximation type A/D converter, but may be a parallel comparison type A/D converter, a servo-balancing type A/D converter, or the like.

The control circuit 70 (control section, processing section, or calculation section) controls each circuit of the integrated circuit device. The control circuit 70 may be implemented by a logic circuit (e.g., gate array), a processor (e.g., CPU), or the like.

Specifically, the control circuit 70 sets an offset adjustment and a gain adjustment of the amplifier circuit 10. For example, when a filter having a variable cut-off frequency (e.g., switched-capacitor filter) is provided between the amplifier circuit 10 and the A/D converter 50, the control circuit 70 may set the cut-off frequency of the filter.

For example, the control circuit 70 sets an offset adjustment of the amplifier circuit 10 by setting the offset adjustment data DA1 to DA3 in the offset adjustment registers RA1 to RA3. For example, the control circuit 70 sets a gain adjustment of the amplifier circuit 10 by setting the gain adjustment data DG1 to DG3 in the gain adjustment registers RG1 to RG3. Specifically, the control circuit 70 reads the offset value data DV1 to DV3 stored in the offset value storage sections RV1 to RV3. The control circuit 70 calculates the offset adjustment data DA1 to DA3 based on the offset value data DV1 to DV3, and sets (stores) the offset adjustment data DA1 to DA3 in the offset adjustment registers RA1 to RA3.

When subjecting the amplifiers AM1 to AM3 to amplifier offset calibration, the control circuit 70 calculates the offset value data DV1 to DV3 based on the digital data ADQ from the A/D converter 50 and the gains G1 to G3 (gain adjustment data) of the amplifiers AM1 to AM3, and sets (stores) the offset value data DV1 to DV3 in the offset value storage sections RV1 to RV3. Specifically, when performing amplifier offset calibration that automatically cancels the offset voltages VOS1 to VOS3 of the amplifiers AM1 to AM3 before the input signal VI is input from a sensor or the like, the control circuit 70 measures the offset voltages VOS1 to VOS3 of the amplifiers AM1 to AM3 by monitoring the digital data ADQ from the A/D converter 50. The control circuit 70 calculates the offset value data DV1 to DV3 corresponding to the offset voltages VOS1 to VOS3 of the amplifiers AM1 to AM3 based on the gains G1 to G3 of the amplifiers AM1 to AM3 when measuring the offset voltages VOS1 to VOS3, and stores the offset value data DV1 to DV3 in the offset value storage sections RV1 to RV3.

When subjecting the input signal VI to signal offset calibration, the control circuit 70 calculates the offset adjustment data DA1 to DA3 based on the offset value data DV1 to DV3 stored in the offset value storage sections RV1 to RV3, and sets the offset adjustment data DA1 to DA3 in the offset adjustment registers RA1 to RA3. Specifically, the offset voltages VOS1 to VOS3 of the amplifiers AM1 to AM3 are canceled by setting the offset adjustment data DA1 to DA3 corresponding to the offset value data DV1 to DV3 in the offset adjustment registers RA1 to RA3. The control circuit 70 then subjects the input signal VI to signal offset calibration.

Figure 2A:
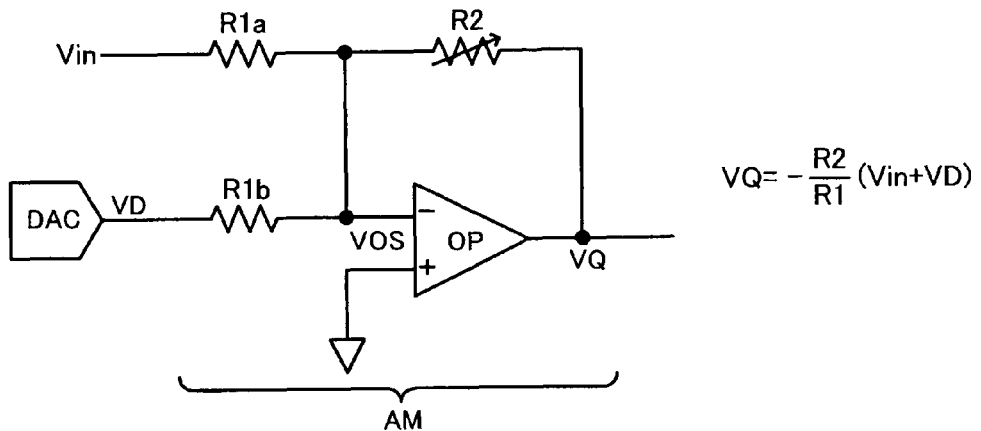
FIGS. 2A to 2C show connection configuration examples of an amplifier and a D/A converter.
Figure 2B:
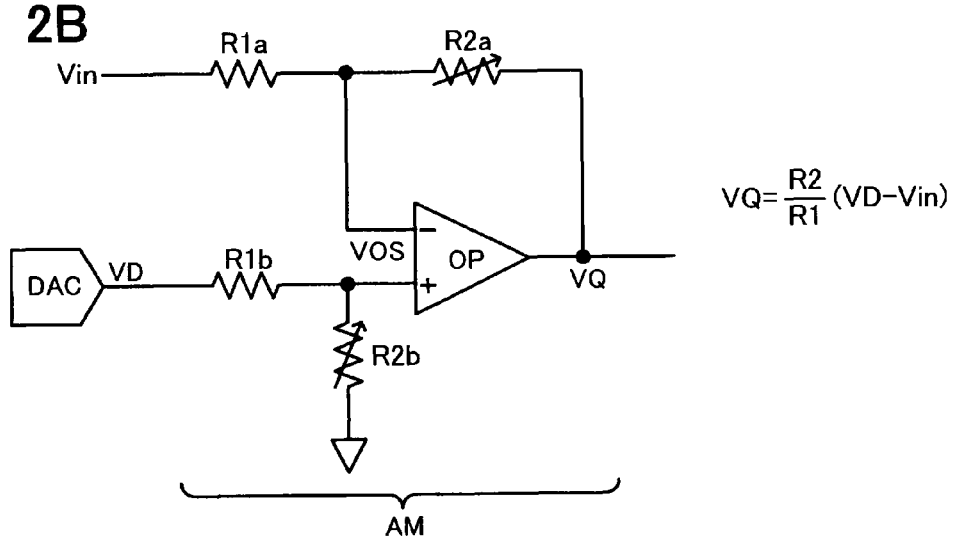
Figure 2C:
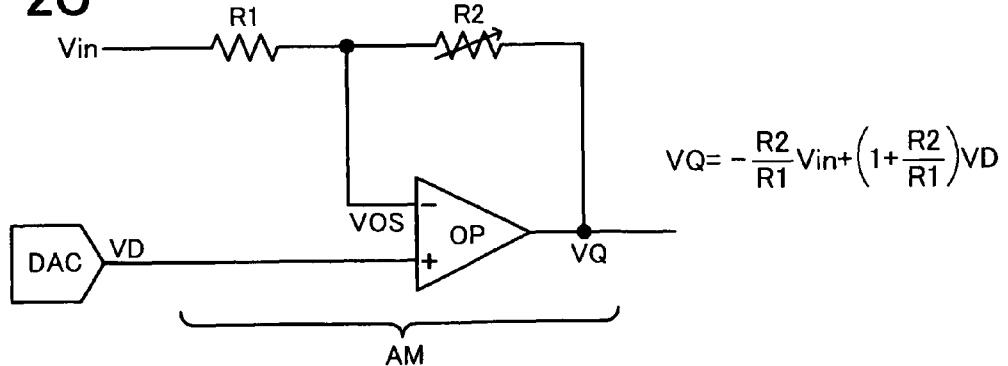

FIGS. 2A to 2C show specific connection configuration examples of the amplifier AM (AM1 to AM3) and the D/A converter DAC (DAC1 to DAC3) provided corresponding to the amplifier AM.

The amplifier AM shown in FIG. 2A includes an operational amplifier OP and resistors R1$a$, R1$b$, and R2. The resistor R1$a$ is provided between an input node of the input signal Vin and an inverting input terminal node of the operational amplifier OP. The resistor R1$b$ is provided between an input node of the output voltage VD from the D/A converter DAC and the inverting input terminal node of the operational amplifier OP. The variable resistor R2 is provided between an output terminal node and the inverting input terminal node of the operational amplifier OP. When the resistances of the resistors R1$a$ and R1$b$ are referred to as R1 and the resistance of the resistor R2 is referred to as R2, the gain of the amplifier AM shown in FIG. 2A is expressed by $-R2/R1$, and the output voltage is expressed by $VQ = -(R2/R1) \times (Vin+VD)$.

In the amplifier AM shown in FIG. 2B, the resistor R1$b$ is provided between the input node of the output voltage VD from the D/A converter DAC and a non-inverting input terminal node of the operational amplifier OP, and a resistor R2$b$ is provided between the non-inverting input terminal node of the operational amplifier OP and a low-potential-side power supply (AGND), differing from FIG. 2A. When the resistances of the resistors R2$a$ and R2$b$ are referred to as R2, the gain of the amplifier AM shown in FIG. 2B is expressed by $R2/R1$, and the output voltage is expressed by $VQ=(R2/R1)\times(VD-Vin)$.

In the amplifier AM shown in FIG. 2C, the resistor R1$b$ is not provided so that the output voltage VD from the D/A converter DAC is input to the non-inverting input terminal node of the operational amplifier OP, differing from FIG. 2A. Note that the output voltage VD from the D/A converter DAC may be input to the inverting input terminal node of the operational amplifier OP, and the non-inverting input terminal of the operational amplifier OP may be connected to the low-potential-side power supply (AGND). The gain of the amplifier AM shown in FIG. 2C with respect to the input signal Vin is expressed by $-R2/R1$, the gain of the amplifier AM shown in FIG. 2C with respect to the output voltage VD is expressed by $(1+R2/R1)$, and the output voltage is expressed by $VQ=-(R2/R1)\times Vin + (1+R2/R1) \times VD$.

As shown in FIGS. 2A to 2C, the gain of the amplifier AM can be adjusted by setting the resistance ratio R2/R1 based on the gain adjustment data. Moreover, an offset adjustment that cancels the offset voltage VOS between the non-inverting input terminal and the inverting input terminal of the operational amplifier OP and the like can be implemented by setting the output voltage VD of the D/A converter DAC based on the offset adjustment data.

In this embodiment, a plurality of amplifiers AM1 to AM3 are provided in the amplifier circuit 10, and a plurality of D/A converters DAC1 to DAC3 are provided corresponding to the amplifiers AM1 to AM3. Specifically, the integrated circuit device has a multi-stage amplifier/multi-stage DAC configuration. The offset adjustment registers RA1 to RA3 for an offset adjustment of the amplifiers AM1 to AM3 and the gain adjustment registers RG1 to RG3 for a gain adjustment of the amplifiers AM1 to AM3 are provided corresponding to the amplifiers AM1 to AM3. The offset value storage sections RV1 to RV3 that store the offset value data (measured offset voltage data) of the amplifiers AM1 to AM3 are also provided.

According to this embodiment that employs such a configuration, an offset adjustment that cancels the offset voltages of the amplifiers AM1 to AM3 and the like can be implemented while suppressing an increase in the circuit scale of the D/A converters DAC1 to DAC3. Specifically, an accurate offset adjustment can be implemented with a small circuit configuration as compared with a single-stage amplifier/single-stage DAC configuration.

According to this embodiment, a signal within an optimum voltage range can be input to the A/D converter 50 even if the input signal VI that varies in DC offset and amplitude is input. Therefore, the dynamic range of the A/D converter can be increased.

For example, since the DC offset, amplitude, and the like of an input signal utilized in a related-art integrated circuit device that includes an A/D converter have been determined to a certain extent corresponding to the specification and the like, it suffices that the A/D converter perform an A/D conversion process within an input voltage range corresponding to the specification.

Figure 4:
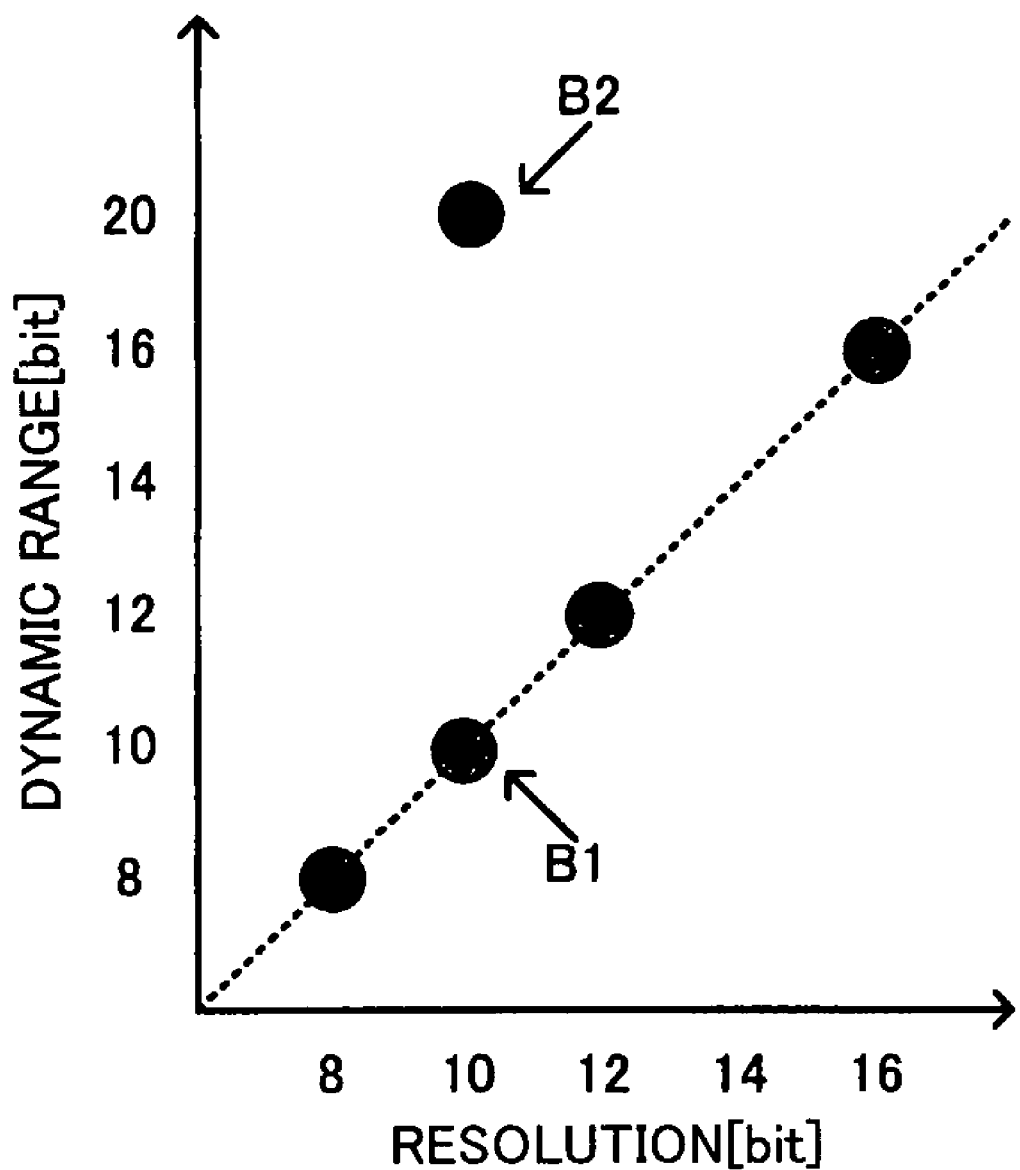
FIG. 4 is a view showing the relationship between a dynamic range and resolution.

However, when performing an A/D conversion process on a detection signal output from a sensor (sensor device) or the like, the DC offset of the input signal VI (detection signal) varies corresponding to the type of sensor, as indicated by A1 and A2 in FIG. 3. The amplitude of the input signal VI also varies corresponding to the type of sensor, as indicated by A3 and A4. Therefore, when performing an A/D conversion process on such an input signal VI, the dynamic range cannot be increased without increasing the A/D conversion resolution, as indicated by B1 in FIG. 4. Specifically, the number of bits of the A/D conversion resolution has been usually increased in order to absorb a change in DC offset, amplitude, and the like of the input signal. However, an increase in the number of bits of the A/D conversion resolution results in an increase in circuit scale, power consumption, and the like. Moreover, design becomes complicated.

According to this embodiment, since the multi-stage amplifiers AM1 to AM3, the multi-stage D/A converters DAC1 to DAC3, and offset adjustment registers RA1 to RA3 corresponding to the multi-stage amplifiers AM1 to AM3 are provided, the DC offset of the input signal VI can be accurately adjusted with a small circuit configuration. Therefore, even if the DC offset of the input signal VI has changed as indicated by A1 and A2 in FIG. 3, an offset adjustment that sets the amplitude center (DC offset) of the signal input to the A/D converter 50 at the center of the input voltage range (VRP to VRN) of the A/D converter 50 can be implemented. This significantly increases the dynamic range.

According to this embodiment, since the multi-stage amplifiers AM1 to AM3 and the gain adjustment registers RG1 to RG3 corresponding to the amplifiers AM1 to AM3 are provided, the gain of the amplitude of the input signal VI can be accurately adjusted using a small circuit. Therefore, even if the amplitude of the input signal VI has changed as indicated by A3 and A4 in FIG. 3, the A/D input amplitude (swing level) (i.e., the amplitude of the signal input to the A/D converter 50) can be made almost constant (see A5) irrespective of the amplitude of the input signal VI. This further increases the dynamic range.

For example, when the A/D input amplitude (maximum input amplitude) of the A/D converter is referred to as VAT and the voltage corresponding to the least significant bit (1LSB) of the A/D converter is referred to as VLSB, the dynamic range DR can be expressed by DR=VAT/VLSB.

According to related-art technology, when the amplitude of the input signal VI is small (see A3 in FIG. 3), the A/D input amplitude VAT also decreases. Therefore, in order to increase the dynamic range DR (=VAT/VLSB), it is necessary to increase the number of bits of the A/D conversion resolution to reduce the voltage VLSB (see B1 in FIG. 4). As a result, an increase in the dynamic range DR is limited.

According to this embodiment, even if the amplitude of the input signal VI has changed as indicated by A3 and A4 in FIG. 3, the A/D input amplitude can be maximized (see A5) by an automatic gain adjustment using the multi-stage amplifiers AM1 to AM3 and the multi-stage gain adjustment registers RG1 to RG3. Therefore, the dynamic range DR can be increased without changing the A/D conversion resolution (e.g., 10 bits) (see B2 in FIG. 4).

According to related-art technology, when the input signal VI has a DC offset (see A1 and A2 in FIG. 3), the output of the amplifier is easily saturated due to amplification of the input signal VI. Therefore, the gain of the amplifier cannot be increased so that the input signal VI cannot be amplified sufficiently. As a result, the input voltage range of the signal input to the A/D converter becomes narrower than the original dynamic range DR of the A/D converter so that the substantial dynamic range DR cannot be increased.

According to this embodiment, even if the input signal VI has a DC offset (see A1 and A2 in FIG. 3), the amplitude center of the signal input to the A/D converter 50 can be set at the center of the input voltage range of the A/D converter 50 by an offset adjustment using the multi-stage amplifiers AM1 to AM3 and the multi-stage D/A converters DAC1 to DAC3, for example. The A/D input amplitude can be maximized (see A5 in FIG. 3) by performing an offset adjustment and a gain adjustment using the gain adjustment registers RG1 to RG3. Therefore, the dynamic range DR can be increased without changing the A/D conversion resolution.

In the development/trial production stage of a new sensor, for example, the DC offset, the amplitude, and the like of a detection signal output from the sensor may be unknown. According to this embodiment, since an automatic offset adjustment and an automatic gain adjustment are performed on the input signal VI (i.e., detection signal output from the sensor), the user can connect the sensor to the integrated circuit device without taking much account of the DC offset, the amplitude, and the like of the detection signal. Therefore, an integrated circuit device (sensor measurement assistance IC) convenient to the user can be provided. Moreover, since it is unnecessary to produce a new integrated circuit device by way of trial corresponding to the type of sensor, the development cost can be reduced.

2. Offset Calibration

The details of offset calibration according to this embodiment are described below. In this embodiment, amplifier offset calibration that cancels the offset voltages of the amplifiers AM1 to AM3 is performed in a state in which a sensor or the like is not connected to the integrated circuit device. Signal offset calibration that adjusts the DC offset of the input signal VI is then performed in a state in which a sensor or the like is connected to the integrated circuit device.

2.1 Amplifier Offset Calibration

FIGS. 5A to 6B are views illustrative of amplifier offset calibration that automatically cancels the offset voltages VOS1 to VOS3 of the amplifiers AM1 to AM3.

In this embodiment, when subjecting the amplifiers AM1 to AM3 (first to Nth amplifiers) to amplifier offset calibration, the offset value data DV1 to DV3 (first to Nth offset value data) is calculated based on the digital data ADQ from the A/D converter 50 and the gains G1 to G3 (gain adjustment data) of the amplifiers AM1 to AM3. The calculated offset value data DV1 to DV3 is set (stored) in the offset value storage sections RV1 to RV3 (first to Nth offset value storage sections).

In FIGS. 5A to 6B, offset calibration is performed in the order from the subsequent-stage amplifier (e.g., in the order of the amplifiers AM3, AM2, and AM1).

Figure 5A:
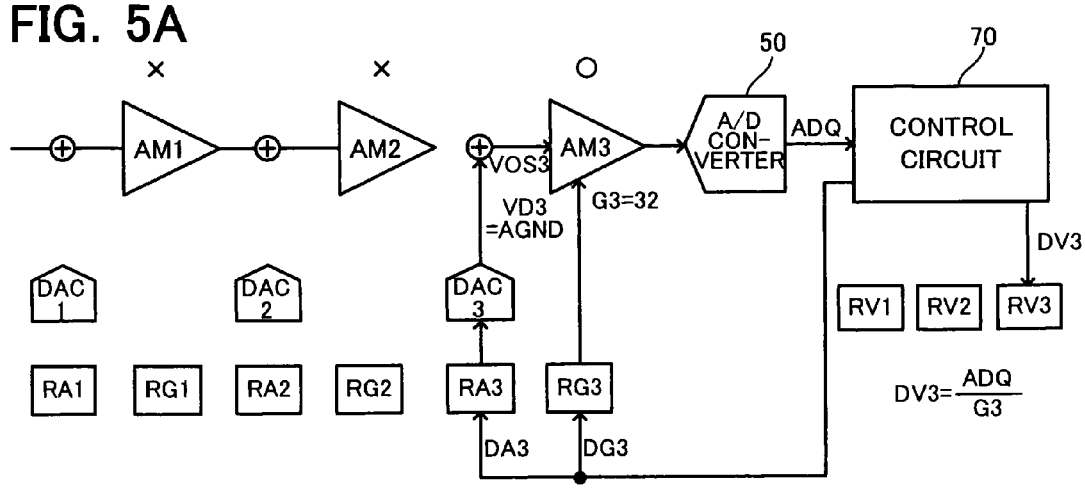
FIGS. 5A to 5C are views illustrative of amplifier offset calibration according to one embodiment of the invention.

Specifically, when performing amplifier offset calibration, offset calibration that measures the offset voltage VOS3 of the amplifier AM3 (jth amplifier in a broad sense; j is an integer that satisfies $1<j\leqq N$) among the amplifiers AM1 to AM3 (first to Nth amplifiers) is performed, as shown in FIG. 5A.

Figure 5B:
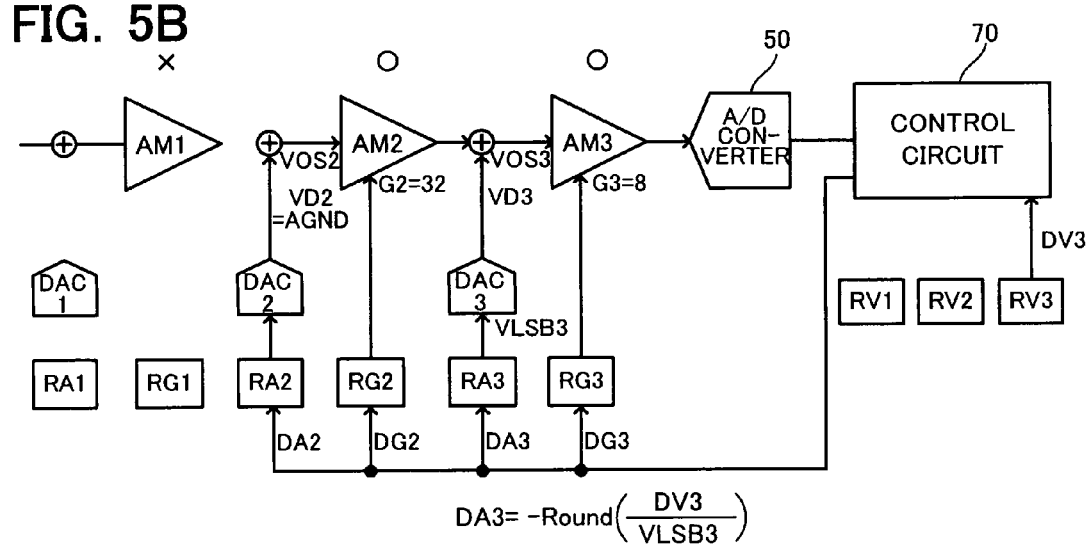
Figure 5C:
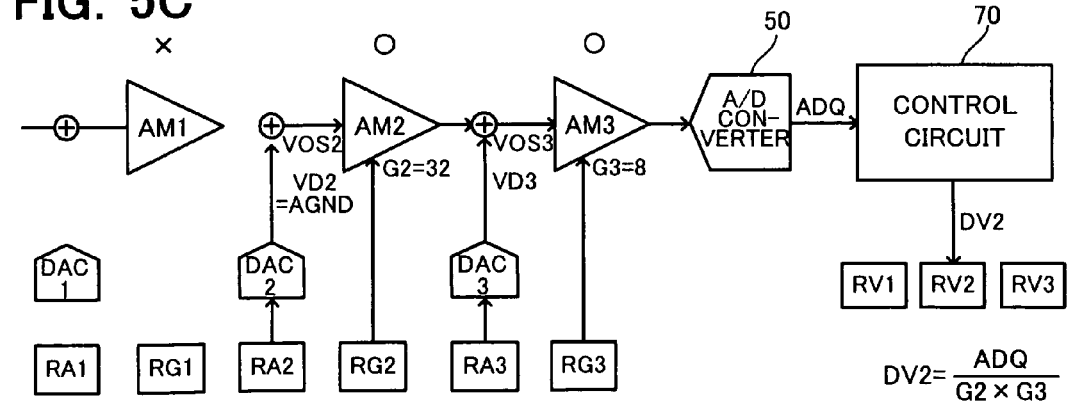
Figure 6A:
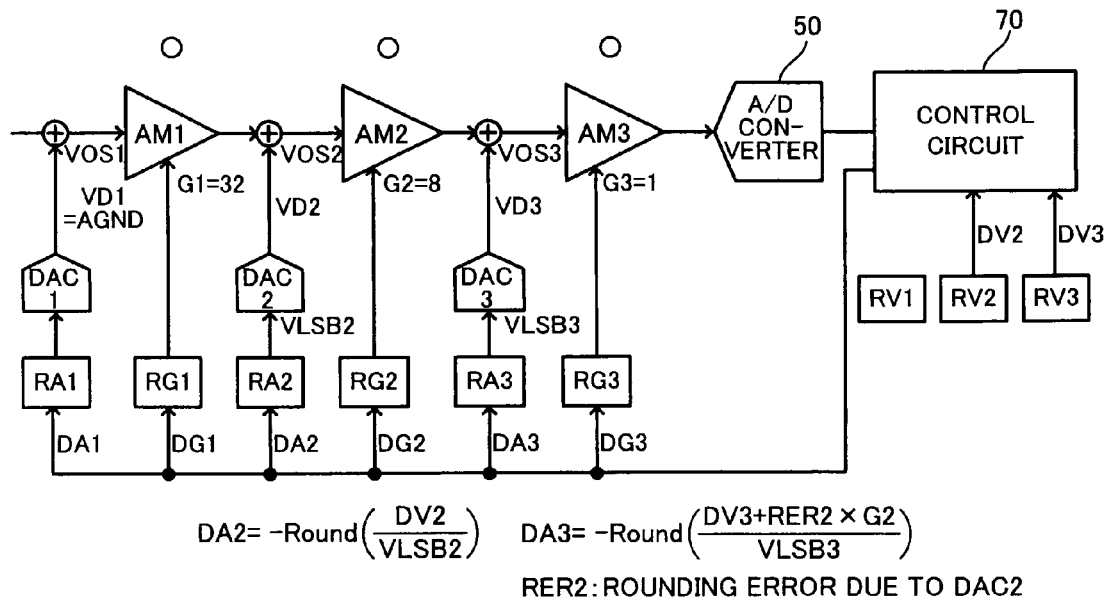
FIGS. 6A and 6B are views illustrative of amplifier offset calibration according to one embodiment of the invention.
Figure 6B:
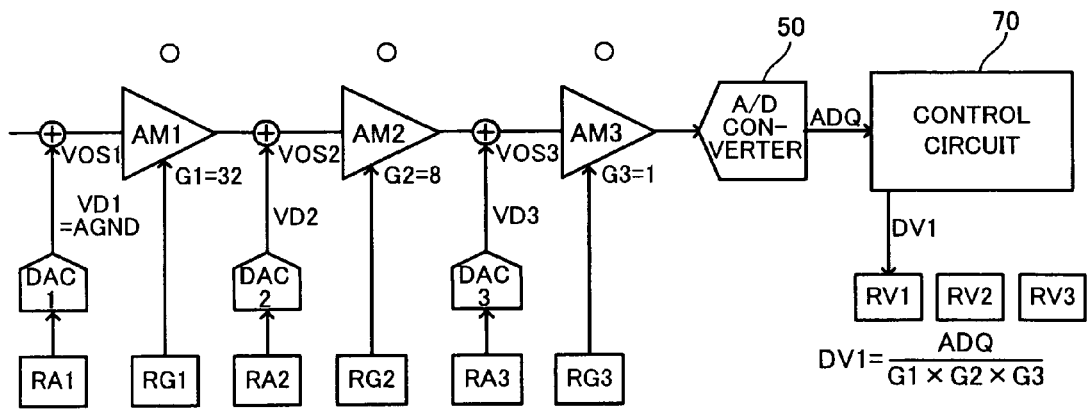

Offset calibration that measures the offset voltage VOS2 of the amplifier AM2 (j−1)th amplifier in a broad sense) in the preceding stage of the amplifier AM3 is then performed, as shown in FIGS. 5B and 5C. Offset calibration that measures the offset voltage VOS1 of the amplifier AM1 is then performed, as shown in FIGS. 6A and 6B.

In FIG. 5A, the amplifiers AM1 and AM2 are disabled, and the amplifier AM3 is enabled. The control circuit 70 sets the gain adjustment data DG3 in the gain adjustment register RG3 so that the gain G3 of the amplifier AM3 is set at a large value (e.g., G3=32) (e.g., maximum gain). Specifically, when subjecting the amplifier AM3 to offset calibration, the gain adjustment data DG3 is set so that the gain G3 of the amplifier AM3 is set at a large value. Therefore, the measurement accuracy of the offset voltage VOS3 of the amplifier AM3 subjected to offset calibration can be improved.

The control circuit 70 sets the offset adjustment data DA3 that sets the output voltage VD3 of the D/A converter DAC3 at an analog reference power supply voltage AGND in the offset adjustment register RA3. Therefore, the D/A converter DAC3 outputs the voltage VD3 set at the analog reference power supply voltage AGND to the amplifier AM3. The analog reference power supply voltage AGND is a voltage (intermediate voltage) between a high-potential-side power supply voltage (VDD) and a low-potential-side power supply voltage (GND=0 V) (e.g., AGND=VDD/2). Note that the analog reference power supply voltage AGND may be set at 0 V.

The control circuit 70 monitors the digital data ADQ from the A/D converter 50 after setting the offset adjustment data DA3 and the gain adjustment data DG3. In FIG. 5A, since the output voltage VD3 of the D/A converter DAC3 is set at the analog reference power supply voltage AGND, the digital data ADQ corresponds to the offset voltage VOS3 of the amplifier AM3. The control circuit 70 calculates the offset value data DV3 corresponding to the offset voltage VOS3 of the amplifier AM3 based on the digital data ADQ from the A/D converter 50 and the gain G3 of the amplifier AM3. Specifically, the offset voltage VOS3 of the amplifier AM3 is amplified by the amplifier AM3 by a factor of G3 so that the digital data ADQ corresponding to G3×VOS3 is output from the A/D converter 50. Therefore, the control circuit 70 calculates the offset value data DV3 (i.e., the measured value of the offset voltage VOS3) by calculating DV3=ADQ/G3, and sets (stores) the offset value data DV3 in the offset value storage section RV3.

Then, the amplifier AM1 is disabled, and the amplifiers AM2 and AM3 are enabled, as shown in FIG. 5B. The control circuit 70 sets the gain adjustment data DG2 and DG3 in the gain adjustment registers RG2 and RG3 to set the gain G2 of the amplifier AM2 at 32 and set the gain G3 of the amplifier AM3 at 8, for example.

The control circuit 70 sets the offset adjustment data DA2 that sets the output voltage VD2 of the D/A converter DAC2 at the analog reference power supply voltage AGND in the offset adjustment register RA2. Therefore, the D/A converter DAC2 outputs the voltage VD2 set at the analog reference power supply voltage AGND to the amplifier AM2.

The control circuit 70 reads the offset value data DV3 set in FIG. 5A from the offset value storage section RV3. The control circuit 70 calculates the offset adjustment data DA3 by calculating DA3=−Round(DV3/VLSB3), and sets the offset adjustment data DA3 in the offset adjustment register RA3. Therefore, the offset voltage VOS3 of the amplifier AM3 is canceled.

Note that VLSB3 that indicates the DAC accuracy is the 1LSB-equivalent voltage VLSB3 of the D/A converter DAC3. Specifically, the 1LSB-equivalent voltage VLSB3 is a voltage corresponding to the amount of change in the output voltage VD3 when changing the input data of the D/A converter DAC3 by 1LSB (1 bit). Round(X) is a function that indicates rounding X off. Since data that indicates an integer in decimal notation must be input to the D/A converter, such a rounding calculation process is necessary.

When DA3=−Round(DV3/VLSB3) is set in the offset adjustment register RA3 (see FIG. 5B), the D/A converter DAC3 outputs a voltage that cancels the offset voltage VOS3 of the amplifier AM3 as the output voltage VD3. Therefore, when subjecting the amplifier AM2 to offset calibration, the offset voltage VOS3 of the amplifier AM3 can be canceled so that the effects of the offset voltage VOS3 can be reduced.

When using the amplifier having the configuration shown in FIG. 2A or 2B, when the gain with respect to the input signal Vin is referred to as GS and the gain with respect to the output voltage VD of the D/A converter DAC is referred to as GD, GS=GD=−R2/R1 or R2/R1 (i.e., the gain GS is the same as the gain GD). According to the configuration shown in FIG. 2C, since GS=−R2/R1 and GD=(1+R2/R1), the gain GS differs from the gain GD. Therefore, when using the amplifier having the configuration shown in FIG. 2C, the offset adjustment data DA3 is calculated as indicated by DA3=−Round (KSD×DV3/VLSB3) (where KSD is the ratio of the gain GS to the gain GD). This also applies to the following description.

In FIG. 5B, when subjecting the amplifier AM2 (j−1)th amplifier) to offset calibration, the gain G2 of the amplifier AM2 is set to be higher than the gain G3 of the subsequent-stage amplifier AM3 (jth amplifier). Therefore, the measurement accuracy of the offset voltage VOS2 of the amplifier AM2 subjected to offset calibration can be improved.

In FIG. 5B, the offset voltage VOS3 of the amplifier AM3 is canceled by setting DA3=−Round(DV3/VLSB3) in the offset adjustment register RA3. However, the rounding calculation process indicated by DA3=−Round(DV3/VLSB3) involves a rounding error value RER3 that is the difference between DV3/VLSB3 and Round(DV3/VLSB3). Therefore, the offset voltage VOS3 cannot be completely canceled even if DA3=−Round(DV3/VLSB3) is set in the offset adjustment register RA3.

In FIG. 5B, the effects of the rounding error value RER3 of the D/A converter DAC3 are reduced by setting the gain G2 of the amplifier AM2 to be higher than the gain G3 of the amplifier AM3 to improve the measurement accuracy of the offset voltage VOS2 of the amplifier AM2.

The control circuit 70 monitors the digital data ADQ from the A/D converter 50 (see FIG. 5C) after setting the offset adjustment data DA2 and DA3 and the gain adjustment data DG2 and DG3 (see FIG. 5B). In FIG. 5B, since the output voltage VD2 of the D/A converter DAC2 is set at the analog reference power supply voltage AGND, the digital data ADQ corresponds to the offset voltage VOS2 of the amplifier AM2. Therefore, the control circuit 70 calculates the offset value data DV2 based on the digital data ADQ from the A/D converter 50 and the gains G2 and G3 of the amplifiers AM2 and AM3. Specifically, the control circuit 70 calculates the offset value data DV2 by calculating DV2=ADQ/(G2×G3), and sets (stores) the offset value data DV2 in the offset value storage section RV2.

The amplifiers AM1, AM2, and AM3 are then enabled, as shown in FIG. 6A. The control circuit 70 sets the gain adjustment data DG1, DG2, and DG3 in the gain adjustment registers RG1, RG2, and RG3 to set the gain G1 of the amplifier AM1 at 32, set the gain G2 of the amplifier AM2 at 8, and set the gain G3 of the amplifier AM3 at 1, for example.

The control circuit 70 sets the offset adjustment data DA1 that sets the output voltage VD1 of the D/A converter DAC1 at the analog reference power supply voltage AGND in the offset adjustment register RA1.

The control circuit 70 reads the offset value data DV2 set in FIG. 5C from the offset value storage section RV2. The control circuit 70 calculates the offset adjustment data DA2 by calculating DA2=−Round(DV2/VLSB2), and sets the offset adjustment data DA2 in the offset adjustment register RA2. Therefore, the offset voltage VOS2 of the amplifier AM2 is canceled.

The control circuit 70 reads the offset value data DV3 set in FIG. 5A from the offset value storage section RV3. The control circuit 70 calculates the offset adjustment data DA3 by calculating DA3=−Round{(DV3+RER2×G2)/VLSB3}, and sets the offset adjustment data DA3 in the offset adjustment register RA3. Therefore, the offset voltage VOS3 of the amplifier AM3 is canceled.

Note that VLSB2 and VLSB3 are the 1LSB-equivalent voltages of the D/A converters DAC2 and DAC3. RER2 is a rounding error value of the D/A converter DAC2. The rounding error value RER2 is the difference between DV2/VLSB2 and Round(DV2/VLSB2). According to the above configuration, since the rounding error value RER2 due to the rounding calculation process that calculates the offset adjustment data DA2 can be reflected in the offset adjustment data DA3 and set in the offset adjustment register RA3, the offset calibration accuracy can be improved.

In FIG. 6A, when subjecting the amplifier AM1 to offset calibration, the gains G1, G2, and G3 of the amplifiers AM1, AM2, and AM3 are set so that the gain G1 of the amplifier AM1 is higher than the gains G2 and G3 of the subsequent-stage amplifiers AM2 and AM3. Therefore, the measurement accuracy of the offset voltage VOS1 of the amplifier AM1 subjected to offset calibration can be improved.

The control circuit 70 monitors the digital data ADQ from the A/D converter 50 (see FIG. 6B) after setting the offset adjustment data DA1, DA2, and DA3 and the gain adjustment data DG1, DG2, and DG3 (see FIG. 6A). In FIG. 6A, since the output voltage VD1 of the D/A converter DAC1 is set at the analog reference power supply voltage AGND, the digital data ADQ corresponds to the offset voltage VOS1 of the amplifier AM1. Therefore, the control circuit 70 calculates the offset value data DV1 corresponding to the offset voltage VOS1 of the amplifier AM1 based on the digital data ADQ from the A/D converter 50 and the gains G1, G2, and G3 of the amplifiers AM1, AM2, and AM3. Specifically, the control circuit 70 calculates the offset value data DV1 by calculating DV1=ADQ/(G1×G2×G3), and sets the offset value data DV1 in the offset value storage section RV1.

The amplifier offset calibration process according to this embodiment is summarized as follows.

In this embodiment, offset calibration (jth offset calibration) that measures the offset voltage VOS3 of the amplifier AM3 (jth amplifier) among the amplifiers AM1 to AM3 is performed, as shown in FIG. 5A.

In this offset calibration, the control circuit 70 calculates the offset value data DV3 (jth offset value data) based on the digital data ADQ from the A/D converter 50 and the gain G3 of the amplifier AM3, as shown in FIG. 5A. Specifically, the control circuit 70 calculates DV3=ADQ/G3, and sets the offset value data DV3 in the offset value storage section RV3.

Then, offset calibration (j−1)th offset calibration) that measures the offset voltage VOS2 of the amplifier AM2 (j−1)th amplifier) among the amplifiers AM1 to AM3 is performed, as shown in FIGS. 5B and 5C.

In this offset calibration, the control circuit 70 calculates the offset adjustment data DA3 (jth offset adjustment data) based on the offset value data DV3 (jth offset value data), and sets the offset adjustment data DA3 in the offset adjustment register RA3 (jth offset adjustment register), as shown in FIG. 5B. Specifically, the control circuit 70 calculates DA3=−Round(DV3/LSB3), and sets the offset adjustment data DA3 in the offset adjustment register RA3.

The control circuit 70 then calculates the offset value data DV2 (j−1)th offset value data) based on the digital data ADQ from the A/D converter 50 and the gains G2 and G3 of the amplifiers AM2 and AM3 (j−1)th and jth amplifiers), and sets the offset value data DV2 in the offset value storage section RV2 (j−1)th offset value storage section), as shown in FIG. 5C. Specifically, the control circuit 70 calculates DV2=ADQ/(G2×G3), and sets the offset value data DV2 in the offset value storage section RV2.

Then, offset calibration (j−2)th offset calibration) that measures the offset voltage VOS1 of the amplifier AM1 (j−2)th amplifier) among the amplifiers AM1 to AM3 is performed, as shown in FIGS. 6A and 6B.

In this offset calibration, the control circuit 70 calculates the offset adjustment data DA2 (j−1)th offset adjustment data) based on the offset value data DV2 (j−1)th offset value data), and sets the offset adjustment data DA2 in the offset adjustment register RA2 (j−1)th offset adjustment register), as shown in FIG. 6A. Specifically, the control circuit 70 calculates DA2=−Round(DV2/VLSB2), and sets the offset adjustment data DA2 in the offset adjustment register RA2.

The control circuit 70 calculates the offset adjustment data DA3 (jth offset adjustment data) based on the offset value data DV2 and DV3 (j−1)th and jth offset value data), and sets the offset adjustment data DA3 in the offset adjustment register RA3 (jth offset adjustment register).

Specifically, the control circuit 70 performs a rounding calculation process that calculates the offset adjustment data DA2 (j−1)th offset adjustment data) based on the offset value data DV2 (j−1)th offset value data). Specifically, the control circuit 70 performs a rounding calculation process indicated by DA2=−Round(DV2/VLSB2). The control circuit 70 calculates the offset adjustment data DA3 (jth offset adjustment data) based on the rounding error value RER2 due to the rounding calculation process, the gain G2 of the amplifier AM2 (j−1)th amplifier), and the offset value data DV3 (jth offset value data). The control circuit 70 sets the offset adjustment data DA3 in the offset adjustment register RA3 (jth offset adjustment register). Specifically, the control circuit 70 calculates DA3=−Round{(DV3+RER2×G2)/VLSB3}, and sets the offset adjustment data DA3 in the offset adjustment register RA3. Therefore, the rounding error value RER2 due to the D/A converter DAC2 can be canceled by the output voltage VD3 of the D/A converter DAC3 so that more accurate offset calibration can be implemented.

The control circuit 70 then calculates the offset value data DV1 (j−2)th offset value data) based on the digital data ADQ from the A/D converter 50 and the gains G1, G2, and G3 of the amplifiers AM1, AM2, and AM3 (j−2)th, (j−1)th, and jth amplifiers), and sets the offset value data DV1 in the offset value storage section RV1 (j−2)th offset value storage section), as shown in FIG. 6B. Specifically, the control circuit 70 calculates DV1=ADQ/(G1×G2×G3), and sets the offset value data DV1 in the offset value storage section RV1.

Therefore, the offset value data DV1 to DV3 corresponding to the offset voltages VOS1 to VOS3 of the amplifiers AM1 to AM3 is automatically calculated and stored in the offset value storage sections RV1 to RV3. Signal offset calibration described below is performed using the offset value data DV1 to DV3 stored in the offset value storage sections RV1 to RV3 to implement signal offset calibration on the input signal VI and the like.

2.2 Signal Offset Calibration

Figure 7A:
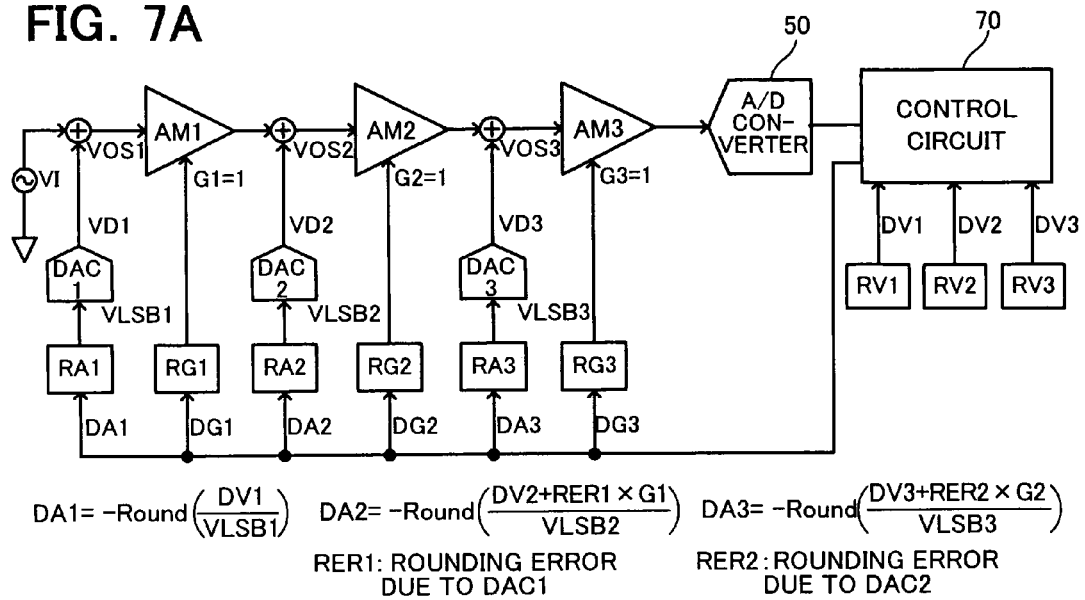
FIGS. 7A to 7C are views illustrative of signal offset calibration according to one embodiment of the invention.
Figure 7B:
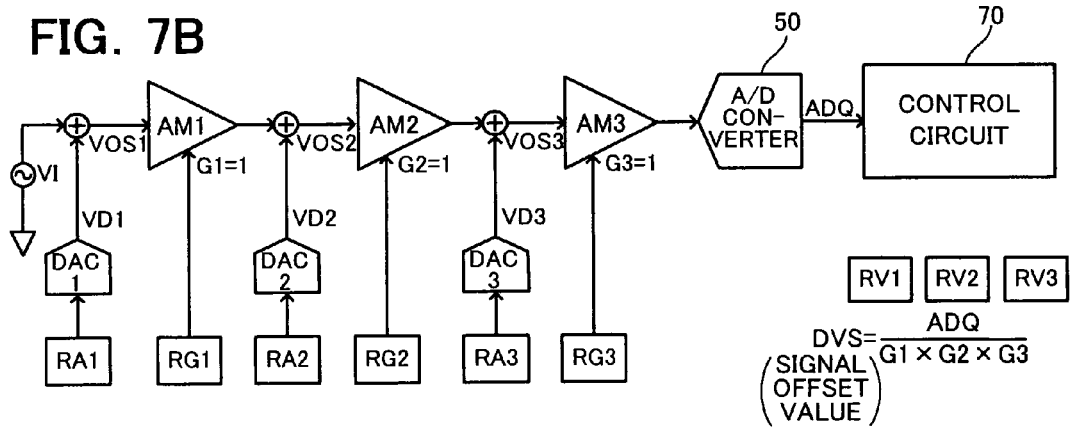
Figure 7C:
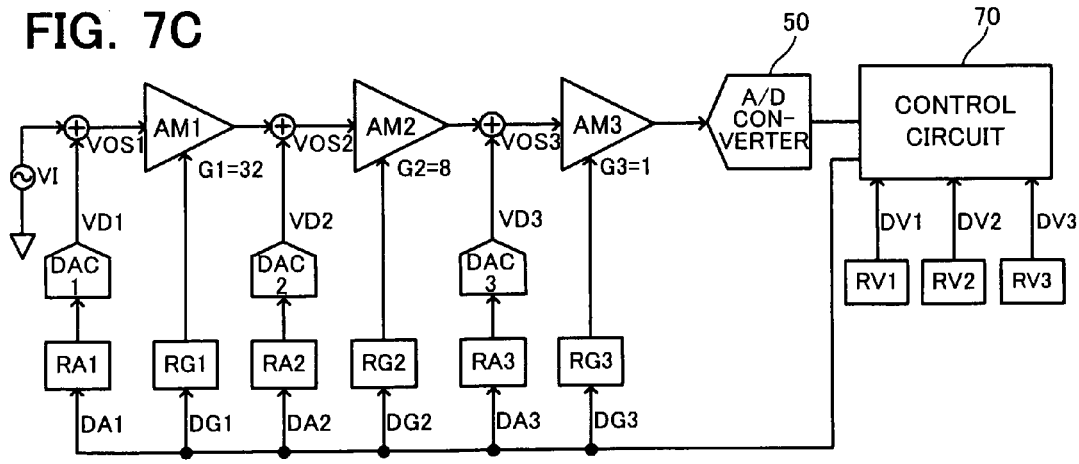
Figure 8:
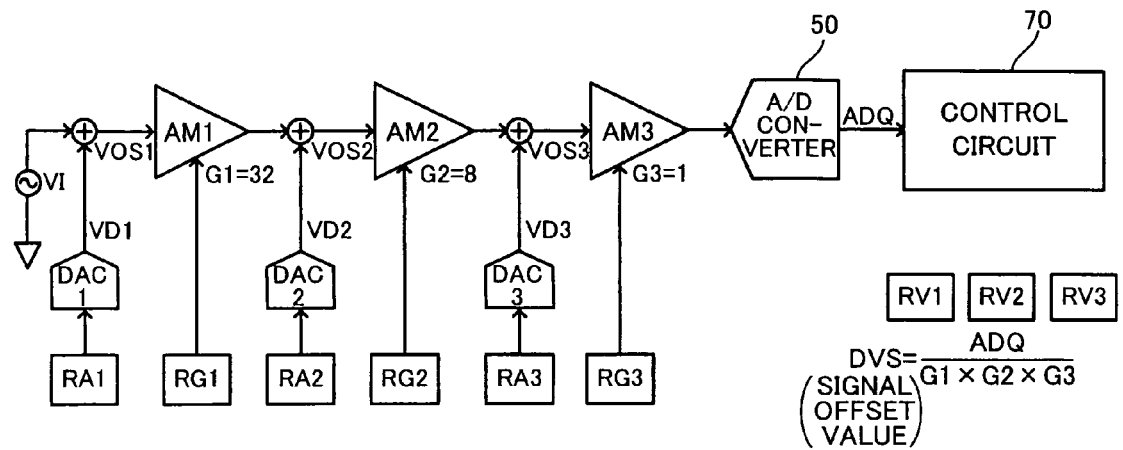
FIG. 8 is a view illustrative of signal offset calibration according to one embodiment of the invention.

FIGS. 7A to 8 are views illustrative of signal offset calibration performed on the input signal VI. In this embodiment, amplifier offset calibration that cancels the offset voltages VOS1 to VOS3 of the amplifiers AM1 to AM3 is performed as described with reference to FIGS. 5A to 6B. A sensor or the like is then connected to the integrated circuit device, and signal offset calibration is performed on the input signal VI from the sensor or the like. Specifically, calibration that sets the amplitude center of the signal input to the A/D converter 50 at the center of the input voltage range of the A/D converter 50 (see A5 in FIG. 3) is performed.

In this embodiment, the offset adjustment data DA1 to DA3 (first to Nth offset adjustment data) is calculated during signal offset calibration based on the offset value data DV1 to DV3 (first to Nth offset value data) stored in the offset value storage sections RV1 to RV3 (first to Nth offset value storage sections). The offset adjustment data DA1 to DA3 is set in the offset adjustment registers RA1 to RA3 (first to Nth offset adjustment registers).

In FIGS. 7A to 8, signal offset calibration is performed in the order from the preceding-stage amplifier (e.g., in the order of the amplifiers AM1, AM2, and AM3). Specifically, the control circuit 70 calculates the offset adjustment data DA1 (ith offset adjustment data; i is an integer that satisfies $1 \leq i < N$) during signal offset calibration, and sets the offset adjustment data DA1 in the offset adjustment register RA1 (ith offset adjustment register). The control circuit 70 then calculates the offset adjustment data DA2 ((i+1)th offset adjustment data), and sets the offset adjustment data DA2 in the offset adjustment register RA2 ((i+1)th offset adjustment register). The control circuit 70 then calculates the offset adjustment data DA3, and sets the offset adjustment data DA3 in the offset adjustment register RA3.

In FIG. 7A, the control circuit 70 sets the gain adjustment data DG1 to DG3 in the gain adjustment registers RG1 to RG3 to set the gains G1 to G3 of the amplifiers AM1 to AM3 at a small value (e.g., G1=G2=G3=1) (e.g., minimum gain). Specifically, the control circuit 70 sets the gains of the amplifiers AM1 to AM3 at gains under a first gain condition.

For example, the input signal VI from the sensor or the like varies in amplitude and DC offset. Therefore, the output of the amplifier may be saturated when the gains G1 to G3 of the amplifiers AM1 to AM3 are set at a large value so that appropriate A/D conversion data may not be obtained.

A situation in which the output of the amplifier is saturated can be prevented by setting the gains of the amplifiers AM1 to AM3 at low gains under the first gain condition (e.g., G1=G2=G3=1), as shown in FIG. 7A.

The control circuit 70 then reads the offset value data DV1 from the offset value storage section RV1. The control circuit 70 calculates the offset adjustment data DA1 by calculating DA1=−Round(DV1/VLSB1), and sets the offset adjustment data DA1 in the offset adjustment register RA1, as shown in FIG. 7A. Therefore, the D/A converter DAC1 outputs the voltage VD1 corresponding to the offset adjustment data DA1 (=−Round(DV1/VLSB1) to the amplifier AM1.

The offset value data DV1 corresponds to the offset voltage VOS1 of the amplifier AM1, as described with reference to FIG. 6B. Therefore, the offset voltage VOS1 of the amplifier AM1 can be canceled by causing the D/A converter DAC1 to output the voltage VD1 corresponding to the offset adjustment data DA1 (=−Round(DV1/VLSB1).

The control circuit 70 reads the offset value data DV2 from the offset value storage section RV2. The control circuit 70 calculates the offset adjustment data DA2 by calculating DA2=−Round{(DV2+RER1×G1)/VLSB2}, and sets the offset adjustment data DA2 in the offset adjustment register RA2. Therefore, the D/A converter DAC2 outputs the voltage VD2 corresponding to the offset adjustment data DA2 (=−Round{(DV2+RER1×G1)/VLSB2}) to the amplifier AM2.

The offset value data DV2 corresponds to the offset voltage VOS2 of the amplifier AM2, as described with reference to FIG. 5C. Therefore, the offset voltage VOS2 of the amplifier AM2 can be canceled by causing the D/A converter DAC2 to output the voltage VD2 corresponding to the offset adjustment data DA2 (=−Round{(DV2+RER1×G1)/VLSB2}).

RER1 is a rounding error value of the D/A converter DAC1. The rounding error value RER1 is the difference between DV1/VLSB1 and Round(DV1/VLSB1). An accurate offset adjustment can be implemented by reflecting the rounding error value RER1 of the D/A converter DAC1 in the D/A converter DAC2.

In FIG. 7A, the offset voltage VOS1 of the amplifier AM1 is canceled by setting DA1=−Round(DV1/VLSB1) in the offset adjustment register RA1. However, the rounding calculation process indicated by DA1=−Round(DV1/VLSB1) involves the rounding error value RER1 that is the difference between DV1/VLSB1 and Round(DV1/VLSB1). Therefore, the offset voltage VOS1 cannot be completely canceled even if DA1=−Round(DV1/VLSB1) is set in the offset adjustment register RA1.

In this embodiment, the offset adjustment data DA2 is calculated based on the rounding error value RER1, the gain G1 of the amplifier AM1, and the offset value data DV2. Specifically, the rounding error value RER1 is multiplied by G1 and added to the offset value data DV2, and the offset adjustment data DA2 is calculated by the calculation expression "DA2=−Round{(DV2+RER1×G1)/VLSB2}". Therefore, the rounding error value RER1 of the offset voltage VOS1 that has not been canceled by the D/A converter DAC1 can be canceled by the D/A converter DAC2 so that the offset calibration accuracy can be improved.

The control circuit 70 reads the offset value data DV3 from the offset value storage section RV3. The control circuit 70 calculates the offset adjustment data DA3 by calculating DA3=−Round{(DV3+RER2×G2)/VLSB3}, and sets the offset adjustment data DA3 in the offset adjustment register RA3. Therefore, the D/A converter DAC3 outputs the voltage VD3 corresponding to the offset adjustment data DA3 (=−Round{(DV3+RER2×G2)/VLSB3}) to the amplifier AM3.

The offset value data DV3 corresponds to the offset voltage VOS3 of the amplifier AM3, as described with reference to FIG. 5A. Therefore, the offset voltage VOS3 of the amplifier AM3 can be canceled by causing the D/A converter DAC3 to output the voltage VD3 corresponding to the offset adjustment data DA3 (=−Round{(DV3+RER2×G2)/VLSB3}).

RER2 is the rounding error value of the D/A converter DAC2. The rounding error value RER2 is the difference between (DV2+RER1×G1)/VLSB2 and Round{(DV2+RER1×G1)/VLSB2}. An accurate offset adjustment can be implemented by reflecting the rounding error value RER2 of the D/A converter DAC2 in the D/A converter DAC3.

The control circuit 70 then monitors the digital data ADQ from the A/D converter 50, as shown in FIG. 7B. In this case, the offset voltages VOS1 to VOS3 of the amplifiers AM1 to AM3 have been canceled by setting the offset adjustment data DA1 to DA3 in the offset adjustment registers RA1 to RA3 as shown in FIG. 7A. Therefore, the digital data ADQ from the A/D converter 50 is data that indicates the signal offset value of the input signal VI.

Therefore, the control circuit 70 calculates signal offset value data DVS based on the digital data ADQ from the A/D converter 50 and the gains G1 to G3 of the amplifiers AM1 to AM3. Specifically, the control circuit 70 calculates the signal offset value data DVS by calculating DVS=ADQ/(G1×G2×G3), and sets the signal offset value data DVS in a register (not shown).

The control circuit 70 then determines the gains G1 to G3 of the amplifiers AM1 to AM3 based on the amplitudes of the signals AQ1 to AQ3 under the first gain condition (i.e., G1=G2=G3=1) shown in FIG. 7A and the like, and sets the gain adjustment data DG1 to DG3 corresponding to the gains G1 to G3 of the amplifiers AM1 to AM3 in the gain adjustment registers RG1 to RG3. In FIG. 7C, the gains of the amplifiers AM1 to AM3 are set so that G1=32, G2=8, and G3=1, for example. Specifically, the gains of the amplifiers AM1 to AM3 are set at gains under a second gain condition (G1=32, G2=8, and G3=1) in which the gains of the amplifiers AM1 to AM3 are set to be higher than those under the first gain condition (G1=G2=G3=1) shown in FIG. 7A.

Specifically, since the input signal VI from the sensor or the like varies in amplitude and DC offset, the gains of the amplifiers AM1 to AM3 are set at low gains under the first gain condition (G1=G2=G3=1) in FIG. 7A. The gains under the second gain condition are determined based on the amplitudes of the signals AQ1 to AQ3 and the like under the first gain condition, and the gains of the amplifiers AM1 to AM3 are reset as shown FIG. 7C. For example, the gain set under the second gain condition is increased as the amplitude decreases. Therefore, even if the amplitude of the input signal VI has changed as indicated by A1 to A4 in FIG. 3, for example, the A/D input amplitude (swing level) of the A/D converter 50 can be made almost constant (see A5 in FIG. 3) independent of the amplitude of the input signal VI. This increases the dynamic range.

As shown FIG. 7C, the gain of the preceding-stage amplifier is set to be higher than the gain of the subsequent-stage amplifier under the second gain condition. For example, the gain G1 of the amplifier AM1 is set to be higher than the gains G2 and G3 of the amplifiers AM2 and AM3. Noise can be reduced by setting the gain of the preceding-stage amplifier to be higher than the gain of the subsequent-stage amplifier.

The control circuit 70 then calculates the offset adjustment data DA1 to DA3 by performing a calculation process similar to that shown in FIG. 7A in a state in which the gains G1 to G3 of the amplifiers AM1 to AM3 are set at the gains under the second gain condition, and sets the offset adjustment data DA1 to DA3 in the offset adjustment registers RA1 to RA3. The control circuit 70 calculates the signal offset value data DVS and the like based on the digital data ADQ from the A/D converter 50 and the gains G1 to G3 of the amplifiers AM1 to AM3, as shown FIG. 8.

The signal offset calibration process according to this embodiment is summarized as follows.

The control circuit 70 sets the gains G1 to G3 under the first gain condition, as shown in FIG. 7A. The control circuit 70 calculates the offset adjustment data DA1 (jth offset adjustment data) based on the offset value data DV1 (jth offset value data), and sets the offset adjustment data DA2 in the offset adjustment register RA2. Specifically, the control circuit 70 calculates DA1=−Round(DV1/VLSB1), and sets the offset adjustment data DA1 in the offset adjustment register RA1.

The control circuit 70 calculates the offset adjustment data DA2 ((i+1)th offset adjustment data) based on the offset value data DV1 and DV2 (ith and (i+1)th offset value data) and the gain G1 of the amplifier AM1 (ith amplifier), and sets the offset adjustment data DA2 in the offset adjustment register RA2 ((i+1)th offset adjustment register). Specifically, the control circuit 70 calculates the offset adjustment data DA2 based on the rounding error value RER1 of the rounding calculation process that calculates the offset adjustment data DA1 based on the offset value data DV1, the gain G1 of the amplifier AM1, and the offset value data DV2 Specifically, the control circuit 70 calculates DA2=−Round{(DV2+RER1×G1)/VLSB2}, and sets the offset adjustment data DA2 in the offset adjustment register RA2. Likewise, the control circuit 70 calculates DA3=−Round{(DV3+RER2×G2)/VLSB3}, and sets the offset adjustment data DA3 in the offset adjustment register RA3.

After the offset adjustment data DA1 to DA3 (first to Nth offset adjustment data) has been set in the offset adjustment registers RA1 to RA3, the control circuit 70 calculates the signal offset value data DVS of the input signal VI based on the digital data ADQ from the A/D converter 50 and the gains G1 to G3 of the amplifiers AM1 to AM3 (first to Nth amplifiers), as shown FIG. 7B. Specifically, the control circuit 70 calculates DVS=ADQ/(G1×G2×G3).

After the control circuit 70 has set the gains of the amplifiers AM1 to AM3 at gains under the first gain condition and calculated the signal offset value data DVS of the input signal VI, the control circuit 70 resets the gains G1 to G3 of the amplifiers AM1 to AM3 to gains under the second gain condition that are higher than those under the first gain condition, as shown FIG. 7C. The control circuit 70 sets the offset adjustment data DA1 to DA3 by performing a calculation process similar to that shown in FIG. 7A, and again calculates the signal offset value data DVS of the input signal, as shown FIG. 8.

Accurate real-time calibration can be implemented by performing signal offset calibration as described above.

3. Multi-Stage Amplifier/Multi-Stage DAC Configuration

As shown in FIG. 1, this embodiment employs the multi-stage amplifier/multi-stage DAC configuration. The advantages of the multi-stage amplifier/multi-stage DAC configuration are described below.

As the configuration of the amplifier circuit, a configuration in which a high-pass filter (HPF) that includes a capacitor C and a resistor R is provided in the preceding stage of an amplifier AM (see FIG. 9A), or a single-stage amplifier/single-stage DAC configuration (see FIG. 9B) may be employed, for example.

In the configuration using the HPF (FIG. 9A), a DC component is cut off utilizing the HPF to cancel the DC offset. The configuration using the HPF achieves high accuracy, but results in a decrease in calibration response speed and an increase in size, as shown in FIG. 9C.

Specifically, the frequency band of the input signal VI (detection signal) from the sensor varies (e.g., within the range from 1 Hz to 16 KHz) corresponding to the type of sensor. For example, when the frequency of the input signal VI is 1 Hz, it is necessary to reduce the cut-off frequency of the HPF shown in FIG. 9A to a value (e.g., 0.1 Hz or less) sufficiently lower than 1 Hz so that the input signal VI having a frequency of 1 Hz to passes through.

However, since the cut-off frequency of the HPF is determined by the reciprocal of CR, it is necessary to increase the capacitance of the capacitor C and the resistance of the resistor R in order to reduce the cut-off frequency of the HPF. Therefore, the size of the capacitor C and the resistor R increases when setting the cut-off frequency at 0.1 Hz, for example. When the capacitor C and the resistor R are provided as external parts, convenience to the user is impaired. Moreover, it is difficult to variably set the capacitance and the resistance corresponding to the frequency band of the input signal VI. When the capacitance of the capacitor C and the resistance of the resistor R are increased, the calibration response speed decreases so that quick calibration cannot be implemented.

The single-stage amplifier/single-stage DAC configuration shown in FIG. 9B achieves a high calibration response speed, but results in an increase in size and a decrease in accuracy, as shown in FIG. 9C.

On the other hand, the multi-stage amplifier/multi-stage DAC configuration according to this embodiment has advantages over the configuration using the HPF and the single-stage amplifier/single-stage DAC configuration with regard to the calibration response speed, size, and accuracy. The details are described below.

For example, when canceling a DC offset VS (input offset) of the input signal VI using the single-stage amplifier/single-stage DAC configuration shown in FIG. 9B, the offset adjustment data DA may be set so that VD=−VS.

An output range QR required for the D/A converter DAC shown in FIG. 9B is almost equal to the DC offset VS of the input signal VI (e.g., about 3 V).

The D/A converter DAC is required to have an accuracy such that the A/D converter 51 does not produce an error. Therefore, when the 1LSB-equivalent voltage (DAC accuracy) of the D/A converter DAC is referred to as VLSB, the 1LSB-equivalent voltage (A/D accuracy) of the A/D converter 51 is referred to as ADLSB, and the gain of the amplifier AM is referred to as (, the relationship "VLSB≦ADLSB/G" is satisfied. Therefore, when ADLSB=0.003 V and G=32, VLSB≦0.003/32=93.75 μV.

The number k of bits required for the D/A converter DAC is determined by $2^k \geq QR/VLSB$. Therefore, when the output range QR of the D/A converter DAC is about 3 V, the number k of bits required for the D/A converter DAC is 15 (k=15) since $2^{15}$=32768≧3/(0.003/32)=32000.

Specifically, when using the single-stage amplifier/single-stage DAC configuration, a 15-bit DAC is required (see FIG. 10A). For example, since it is necessary to reduce the 1LSB-equivalent voltage VLSB (DAC accuracy) as the accuracy of the A/D converter 51 increases (the 1LSB-equivalent voltage ADLSB decreases), it is necessary to further increase the number of bits of the D/A converter DAC, as indicated by the relational expression "$2^k \geq QR/VLSB$".

However, the size of the D/A converter DAC increases exponentially with respect to the number of bits, as shown in FIG. 9D. Therefore, when the number of bits of the D/A converter DAC is set at 15, the size of the D/A converter DAC increases to a large extent. As a result, the size of the integrated circuit device also increases. Specifically, it is difficult to reduce the circuit scale while increasing the calibration accuracy when using the single-stage amplifier/single-stage DAC configuration.

In this embodiment, the multi-stage amplifier/multi-stage DAC configuration is employed, as shown in FIG. 10B. The DC offset of the input signal VI is referred to as VS, the gains of the amplifiers AM1 to AM3 are respectively referred to as G1 to G3, the output voltages of the D/A converters DAC1 to DAC3 are respectively referred to as VD1 to VD3, and the output voltage of the amplifier AM3 is referred to as VAQ. In this case, the relationship "VAQ=G1×G2×G3×VS+G1×G2×G3×VD1+G2×G3×VD2+G3×VD3" is satisfied.

Therefore, the DC offset VS of the input signal VI can be canceled by setting the output voltages VD1 to VD3 of the D/A converters DAC1 to DAC3 so that VS=−{VD1+VD2/G1+VD3/(G1×G2)} is satisfied.

When using the multi-stage amplifier/multi-stage DAC configuration shown in FIG. 10B, the output range QR1 of the D/A converter DAC1 may be set to be almost equal to the DC offset VS of the input signal VI (e.g., about 3 V). Specifically, most of the DC offset VS is corrected by the output voltage VD1 of the first-stage D/A converter DAC1, and an error value is corrected by the output voltages VD2 and VD3 of the subsequent-stage D/A converters DAC2 and DAC3.

When the 1LSB-equivalent voltages (DAC accuracy) of the D/A converters DAC1, DAC2, and DAC3 are referred to as VLSB1, VLSB2, and VLSB3, the output range QR2 of the D/A converter DAC2 satisfies the relationship "QR2≧G1×VLSB1" (described in detail later). The output range QR3 of the D/A converter DAC3 satisfies the relationship "QR3≧G2×VLSB2".

For example, since the 1LSB-equivalent voltage VLSB3 (accuracy) required for the D/A converter DAC3 is within a range such that the A/D converter 50 does not produce an error, the relationship "VLSB3≦ADLSB/G3" is satisfied when the 1LSB-equivalent voltage of the A/D converter 50 is referred to as ADLSB.

The number k of bits required for the D/A converter DAC1 is determined by the relational expression "$2^k \geq QR1/VLSB1$". Likewise, the numbers k of bits required for the D/A converters DAC2 and DAC3 are respectively determined by the relational expressions "$2^k \geq QR2/VLSB2$" and "$2^k \geq QR3/VLSB3$".

Therefore, when the gains G1, G2, and G3 of the amplifiers AM1 to AM3 are 4, 4, and 2, respectively, the relationship shown in FIG. 10C is satisfied, for example.

Specifically, the output range QR1 of the D/A converter DAC1 is almost equal to the DC offset VS of the input signal VI (e.g., about 3 V). Therefore, when the number k of bits of the D/A converter DAC1 is five (k=5), the 1LSB-equivalent voltage VLSB1 of the D/A converter DAC1 may be set at 96 mV (see FIG. 10C) based on the relational expression "VLSB1=QR1/$2^5$".

The output range QR2 and the 1LSB-equivalent voltage VLSB2 of the D/A converter DAC2 satisfy the relationships "QR2≧G1×VLSB1" and "VLSB2=QR2/$2^5$". Therefore, the output range QR2 and the 1LSB-equivalent voltage VLSB2 may be set so that QR=G1×VLSB1=4×96 mV=0.384 V and VLSB2=QR2/$2^5$=0.384/$2^5$ V=12 mV.

The output range QR2 and the 1LSB-equivalent voltage VLSB3 of the D/A converter DAC3 satisfy the relationships "QR3≧G2×VLSB2" and "VLSB3=QR3/$2^5$". Therefore, the output range QR3 and the 1LSB-equivalent voltage VLSB3 may be set so that QR3=G2×VLSB2=4×12 mV=48 V and VLSB3=QR3/$2^5$=48/$2^5$ V=1.5 mV.

As is clear from the comparison between FIG. 10A and FIG. 10C, the single-stage amplifier/single-stage DAC configuration requires a DAC resolution of 15 bits while it suffices to provide three 5-bit D/A converters DAC1 to DAC3 when using the multi-stage amplifier/multi-stage DAC configuration, for example. As is clear from FIG. 9D, the circuit area of one 15-bit D/A converter DAC is significantly larger than the circuit area of the three 5-bit D/A converters DAC1 to DAC3. Therefore, the circuit scale can be significantly reduced by the multi-stage amplifier/multi-stage DAC configuration according to this embodiment as compared with the single-stage amplifier/single-stage DAC configuration.

According to the single-stage amplifier/single-stage DAC configuration shown in FIG. 10A, the 1LSB-equivalent voltage VLSB (DAC accuracy) is 93.75 μV even though the number of bits of the D/A converter DAC is increased to 15. As a result, the offset calibration accuracy cannot be increased to a large extent.

According to the multi-stage amplifier/multi-stage DAC configuration shown in FIG. 10C, most of the DC offset VS is corrected by the first-stage D/A converter DAC1, and a correction error is corrected by the subsequent-stage D/A converters DAC2 and DAC3. Since the 1LSB-equivalent voltage VLSB3 (DAC accuracy) of the D/A converter DAC3 is as small as 1.5 mV, accurate offset calibration can be implemented as compared with the single-stage amplifier/single-stage DAC configuration shown in FIG. 10A.

4. Method of Setting Output Range and 1LSB-Equivalent Voltage of D/A Converter

A method of setting the output range and the 1LSB-equivalent voltage of the D/A converter according to this embodiment is described in detail below.

Figure 11A:
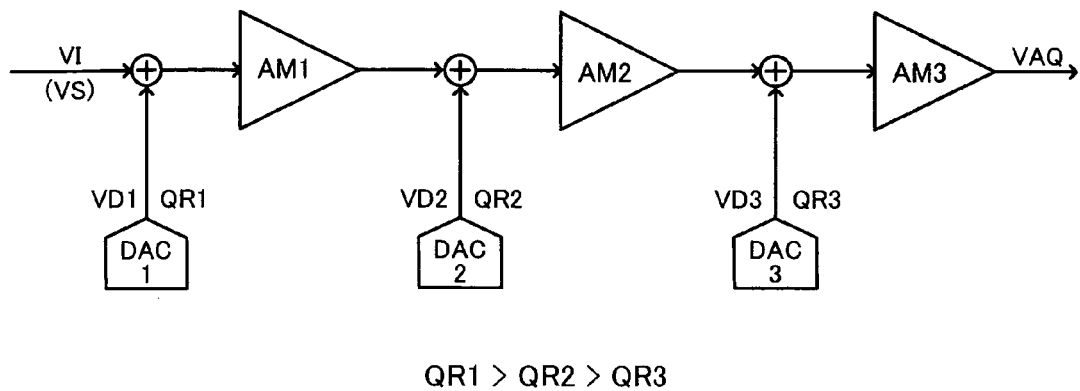
FIGS. 11A and 11B are views illustrative of a method of setting the output range and the 1LSB-equivalent voltage of a D/A converter.

In FIG. 11A, the output range of the subsequent-stage D/A converter is set to be narrower than the output range of the preceding-stage D/A converter. The output range of the D/A converter DAC1 (ith D/A converter) among the D/A converters DAC1 to DAC3 (first to Nth D/A converters) is referred to as QR1, and the output range of the D/A converter DAC2 ((i+1)th D/A converter) in the subsequent stage of the D/A converter DAC1 is referred to as QR2. The output ranges of the D/A converters DAC1 and DAC2 are set so that the relationship "QR1>QR2" is satisfied. Likewise, the output ranges of the D/A converters DAC2 and DAC3 are set so that the relationship "QR2>QR3" is satisfied. Note that modifications may be made, such as setting the output ranges so that the relationships "QR1>QR2" and "QR2=QR3" are satisfied, or setting the output ranges so that the relationships "QR1=QR2" and "QR2>QR3" are satisfied.

Figure 11B:
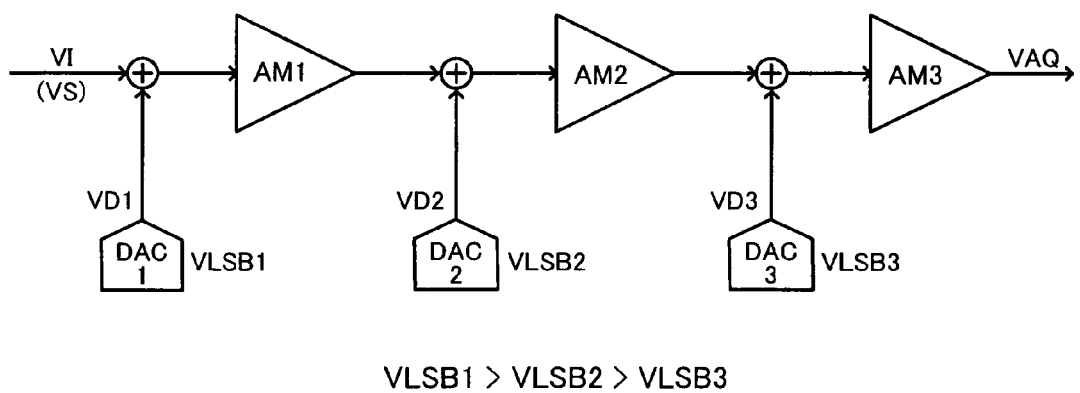

In FIG. 11B, the 1LSB-equivalent voltage of the subsequent-stage D/A converter is set to be lower than the 1LSB-equivalent voltage of the preceding-stage D/A converter. Specifically, when the 1LSB-equivalent voltage of the D/A converter DAC1 (ith D/A converter) among the D/A converters DAC1 to DAC3 is referred to as VLSB1 and the 1LSB-equivalent voltage of the D/A converter DAC2 ((i+1)th D/A converter) in the subsequent stage of the D/A converter DAC1 is referred to as VLSB2, the relationship "VLSB1>VLSB2" is satisfied. Likewise, the 1LSB-equivalent voltages of the D/A converters DAC2 and DAC3 are set so that the relationship "VLSB2>VLSB3" is satisfied. Note that modifications may be made, such as setting the 1LSB-equivalent voltages so that the relationships "VLSB1>VLSB2" and "VLSB2=VLSB3" are satisfied, or setting the 1LSB-equivalent voltages so that the relationships "VLSB1=VLSB2" and "VLSB2>VLSB3" are satisfied.

Figure 12:
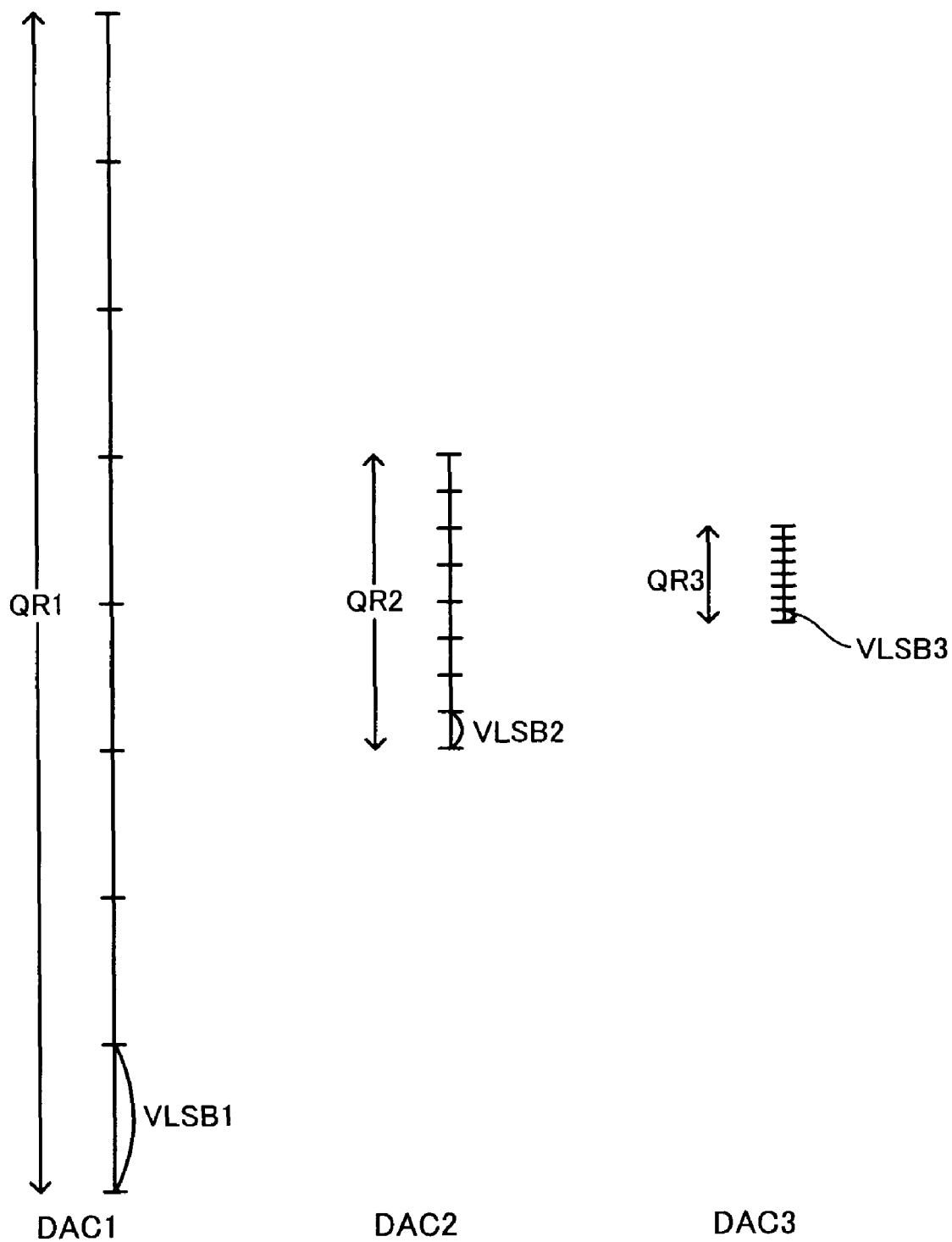
FIG. 12 is a view illustrative of a method of setting the output range and the 1LSB-equivalent voltage of a D/A converter.

FIG. 12 is a view showing the details of the relationships shown in FIGS. 11A and 11B. As shown in FIG. 12, the output range QR1 of the preceding-stage D/A converter DAC1 is wider than the output range QR3 of the subsequent-stage D/A converter DAC3. The 1LSB-equivalent voltage VLSB1 of the preceding-stage D/A converter DAC1 is higher than the 1LSB-equivalent voltage VLSB3 of the subsequent-stage D/A converter DAC3.

When the output range QR1 of the D/A converter DAC1 is increased, as shown FIG. 11A, most of the DC offset VS of the input signal VI can be canceled by the output voltage VD1 of the D/A converter DAC1 by setting the output range QR1 of the D/A converter DAC1 to be almost equal to the range of the DC offset VS of the input signal VI, for example. Since most of the DC offset VS is canceled by the D/A converter DAC1, an error value that has not been removed by the D/A converter DAC1 can be removed by the output voltages VD2 and VD3 of the subsequent-stage D/A converters DAC2 and DAC3 without increasing the output ranges QR2 and QR3 of the subsequent-stage D/A converters DAC2 and DAC3 to a large extent. Specifically, the DC offset VS can be appropriately corrected by setting the output ranges so that the relationship "QR1>QR2>QR3" is satisfied.

The D/A converter DAC1 roughly corrects the DC offset VS, and accurate offset correction is implemented by the subsequent-stage D/A converters DAC2 and DAC3. Therefore, since the D/A converter DAC1 need not have high accuracy, the 1LSB-equivalent voltage VLSB1 can be increased, as shown in FIG. 11B. On the other hand, the D/A converter DAC2 must accurately correct an error value that has not been removed by the D/A converter DAC1, and the D/A converter DAC3 must accurately correct an error value that has not been removed by the D/A converter DAC2. Therefore, the 1LSB-equivalent voltages VLSB2 and VLSB3 are set to be lower than the 1LSB-equivalent voltage VLSB1. Specifically, the DC offset VS can be accurately calibrated by setting the 1LSB-equivalent voltages so that the relationship "VLSB1>VLSB2>VLSB3" is satisfied.

For example, when using the single-stage amplifier/single-stage DAC configuration shown in FIG. 9B, if the output range QR of the D/A converter DAC is increased in order to deal with the range of the DC offset VS and the 1LSB-equivalent voltage of the D/A converter DAC is reduced in order to implement accurate calibration, the number of bits of the D/A converter DAC increases (see FIG. 10A) so that the circuit scale increases.

On the other hand, when the relationships "QR1>QR2>QR3" and "VLSB1>VLSB2>VLSB3" are satisfied (see FIGS. 11A and 11B), the number of bits of the D/A converter DAC1 need not be increased to a large extent even if the output range QR of the D/A converter DAC is increased in order to deal with the range of the DC offset VS since the 1LSB-equivalent voltage VLSB1 is high, as shown in FIG. 12. Therefore, the number of bits of the D/A converter DAC1 can be reduced (see FIG. 10C).

On the other hand, the number of bits of the D/A converter DAC3 need not be increased to a large extent even if the 1LSB-equivalent voltage VLSB3 of the D/A converter DAC3 is reduced in order to implement accurate calibration since the output range VR3 of the D/A converter DAC3 is narrow, as shown in FIG. 12. Therefore, the number of bits of the D/A converter DAC3 can also be reduced (see FIG. 10C).

According to the method shown in FIGS. 11A and 11B, an increase in circuit scale can be prevented while increasing the calibration accuracy when calibrating the DC offset VS.

Figure 13:
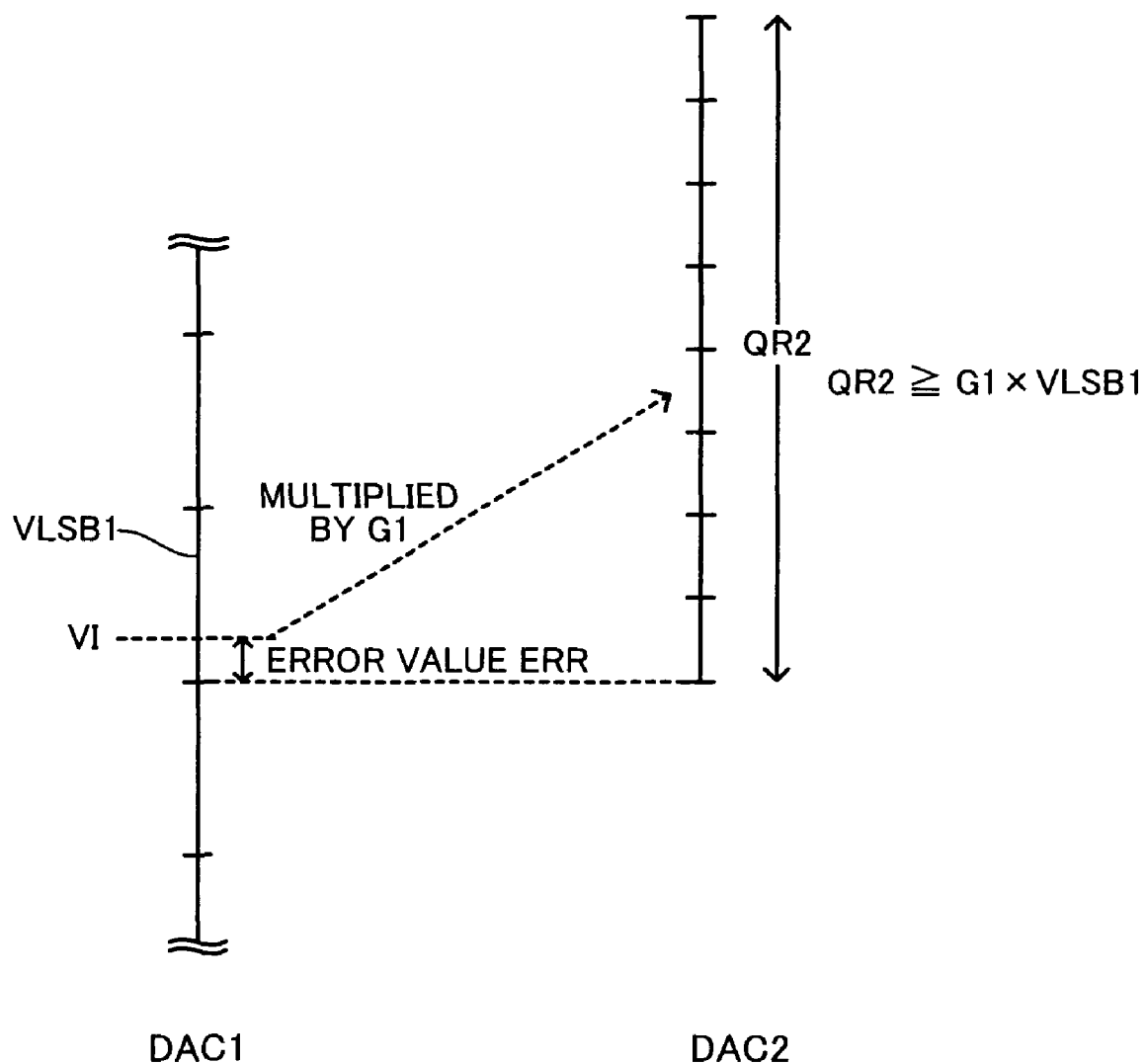
FIG. 13 is a view illustrative of a method of setting the output range and the 1LSB-equivalent voltage of a D/A converter.

When the gain of the amplifier AM1 (ith amplifier) is referred to as G1 and the 1LSB-equivalent voltage of the D/A converter DAC1 (ith D/A converter) is referred to as VLSB1, the relationship "QR2≧G1×VLSB1" is satisfied, as shown in FIG. 13. Likewise, when the gain of the amplifier AM2 is referred to as G2 and the 1LSB-equivalent voltage of the D/A converter DAC2 is referred to as VLSB2, the relationship "QR3≧G2×VLSB2" is satisfied.

Specifically, an error value ERR that has not been removed by the D/A converter DAC1 must be removed by the D/A converter DAC2, as shown in FIG. 13. The error value ERR is amplified by the amplifier AM1 by a factor of G1. Therefore, the output range QR2 of the D/A converter DAC2 must be greater than G1×ERR. Specifically, the relationship "QR2≧G1×ERR" is satisfied.

Since the error value ERR is a quantization error of the D/A converter DAC1, the error value ERR is equal to or less than the 1LSB-equivalent voltage VLSB1 of the D/A converter DAC1. Specifically, the relationship "ERR≦VLSB1" is satisfied. Therefore, the relationship "QR2≧G1×VLSB1" is satisfied from the relationships "QR2≧G1×ERR" and "ERR≦VLSB1". Likewise, the relationship "QR3≧G2×VLSB2" is satisfied. These relationships ensure that the error value that has not been removed by the preceding-stage D/A converter can be removed by the subsequent-stage D/A converter.

5. First Modification

Figure 14:
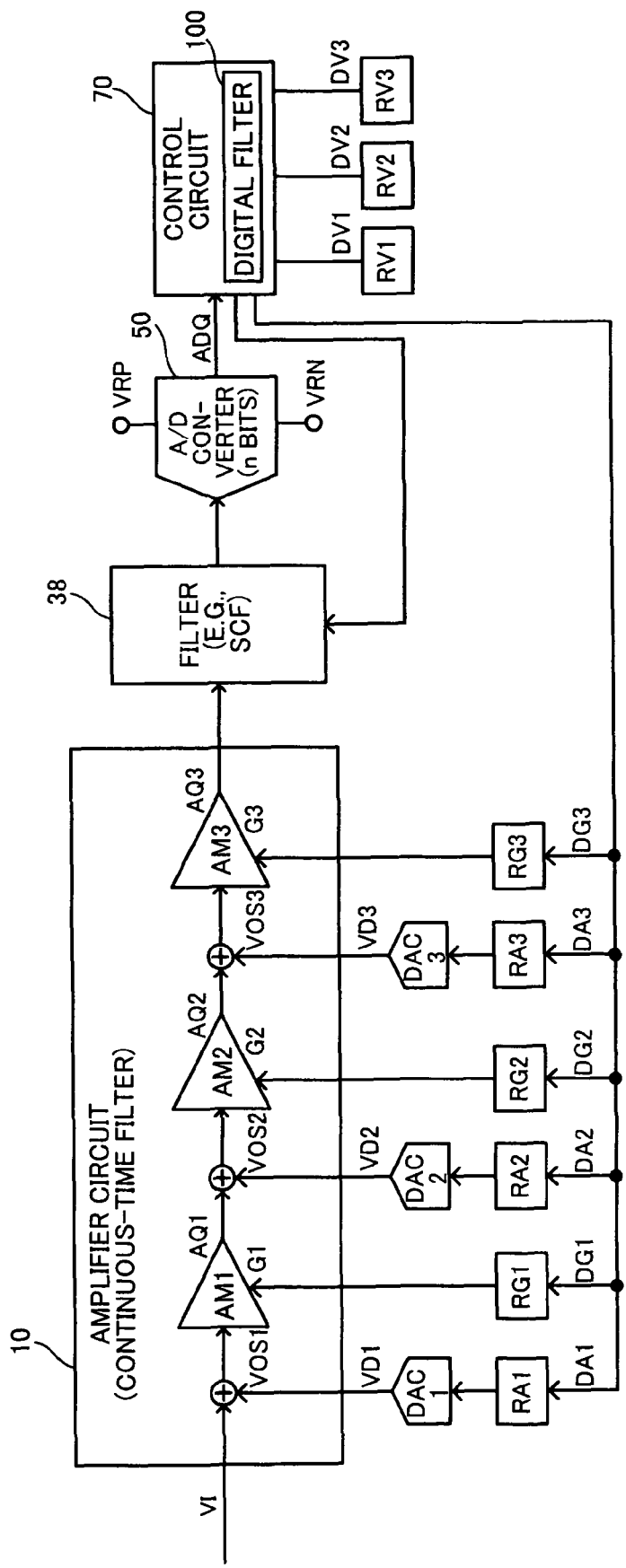
FIG. 14 shows a first modification of one embodiment of the invention.

FIG. 14 shows a first modification of this embodiment. In FIG. 14, a filter 38 is provided in addition to the elements shown in FIG. 1. A digital filter 100 is also implemented by the control circuit 70. Note that various modifications may be made, such as providing the filter 38 without providing the digital filter 100, or providing the digital filter 100 without providing the filter 38.

The filter 38 is provided in the subsequent stage of the amplifier circuit 10, and performs a filter process such as a low-pass filter (LPF) process. Specifically, the filter 38 is provided between the amplifier circuit 10 and the A/D converter 50, for example. The cut-off frequency of the filter 38 is variably set corresponding to the frequency band of the input signal VI, for example. Specifically, the cut-off frequency of the filter 38 is reduced the frequency band (passband cut-off frequency) of the input signal VI decreases. In this case, the control circuit 70 variably sets the cut-off frequency of the filter 38.

The filter 38 may function as a prefilter for the A/D converter 50. Specifically, the filter 38 performs a filter process that prevents folding noise that occurs when a harmonic signal folds over the frequency band of the input signal VI from exceeding the 1LSB-equivalent voltage (quantization error voltage) of the A/D converter 50.

A switched-capacitor filter (SCF) (i.e., discrete-time filter) may be used as the filter 38, for example. The SCF includes a switch element, an operational amplifier, and a capacitor. The SCF performs a sample-hold operation at a given sampling frequency.

When using the SCF as the filter 38, the amplifier circuit 10 may function as a continuous-time filter (RC active filter). In this case, the continuous-time filter (amplifier circuit 10) functions as a prefilter (LPF) for the SCF, and prevents folding noise in the SCF.

The digital filter 100 receives the digital data ADQ from the A/D converter 50, performs a digital filter process (e.g., LPF process) on the digital data ADQ, and outputs digital data obtained by the digital filter process. The digital filter 100 performs the filter process using the continuous-time filter (amplifier circuit 10) and the filter 38 (SCF) as prefilters, for example. As the digital filter 100, an infinite impulse response (IIR) filter or a finite impulse response (FIR) filter may be used.

The cut-off frequency of the digital filter 100 (second discrete-time filter) is variably set corresponding to the frequency band (passband) of the input signal VI, for example. For example, the cut-off frequency of the digital filter 100 decreases as the frequency band of the input signal VI decreases. The sampling frequency of the digital filter 100 is also variably set.

The control circuit 70 sets an offset adjustment and a gain adjustment of the amplifier circuit 10, and sets the cut-off frequencies of the filter 38 and the digital filter 100. Specifically, the control circuit 70 includes an internal register in which the cut-off frequency and the sampling frequency are set. An external instrument (e.g., software or firmware that controls an electronic instrument) sets the cut-off frequency and the sampling frequency in the internal register through an interface (not shown). The control circuit 70 instructs the filter 38 and the digital filter 100 to set the cut-off frequency and the sampling frequency based on the data set in the internal register. Therefore, the filter 38 and the digital filter 100 perform the filter process based on the cut-off frequency and the sampling frequency.

According to the first modification shown in FIG. 14, the filter band can be variably set while performing an offset adjustment and a gain adjustment. Specifically, the cut-off frequency of the filter is variably set corresponding to the frequency band (passband) of the input signal VI.

For example, when performing an A/D conversion process on a detection signal output from a sensor or the like, the frequency band of the detection signal varies corresponding to the type of sensor. Therefore, it is difficult for a related-art integrated circuit device of which the frequency band of the input signal has been determined by the specification and the like perform an A/D conversion process on a detection signal output from a sensor that varies in frequency band. When developing and producing a new sensor by way of trial, it is necessary to develop an integrated circuit device corresponding to each sensor This results in an increase in development cost and development period.

According to the first modification shown in FIG. 14, the cut-off frequency of the filter is variably set corresponding to the frequency band of the input signal VI. Specifically, the cut-off frequency of the filter 38 and the cut-off frequency of the digital filter 100 are variably set corresponding to the frequency band of the input signal VI. Therefore, the cut-off frequency can be variably set in the range between 1 Hz and 16 KHz, for example. This makes it possible to deal with input signals VI in various frequency bands so that a novel integrated circuit device can be provided.

Specifically, it has been difficult to deal with a first type of sensor that outputs a detection signal having a frequency of 1 Hz and a second type of sensor that outputs a detection signal having a frequency of 16 KHz using a single integrated circuit device, for example. This makes it necessary to separately develop an integrated circuit device for the first type of sensor and an integrated circuit device for the second type of sensor.

On the other hand, since the integrated circuit device shown in FIG. 14 has a variable filter function, it is possible to deal with the first type of sensor and the second type using single integrated circuit device. Therefore, an increase in development cost and development period can be prevented. Moreover, the user can connect the sensor to the integrated circuit device without taking much account of the frequency band of the detection signal. Therefore, a user-friendly integrated circuit device can be provided.

In FIG. 14, the continuous-time filter (amplifier circuit 10) functions as a prefilter for the filter 38 (SCF), and the continuous-time filter and the filter 38 function as prefilters for the digital filter 100 (and the A/D converter 50). The band can be variably set over a wide range (e.g., 1 Hz to 16 KHz).

As a comparative example, only the continuous-time filter may be provided as a prefilter for the digital filter 100 without providing the filter 38 (SCF). According to this comparative example, when using an RC filter as the continuous-time filter, the cut-off frequency is determined by the reciprocal of the RC product (i.e., product of resistance and capacitance). Therefore, it is necessary to increase the resistance and the capacitance in order to deal with various frequency bands. This makes it difficult to incorporate the resistor and the capacitor in an IC chip. As a result, the resistor and the capacitor must be provided externally.

In FIG. 14, the filter 38 is provided between the amplifier circuit 10 (continuous-time filter) and the A/D converter 50. The cut-off frequency of the filter 38 and the cut-off frequency of the digital filter 100 are variably set. Therefore, the filter characteristics of the entire system can be variably set corresponding to the input signal VI that varies in frequency band. Moreover, the cut-off frequency of the filter 38 is variably set by changing the capacitance ratio of a plurality of capacitors (i.e., has no size dependence). Therefore, a resistor and a capacitor can be easily incorporated in an IC chip as compared with the method that sets the cut-off frequency using only the continuous-time filter (RC filter).

6. Second Modification

Figure 15:
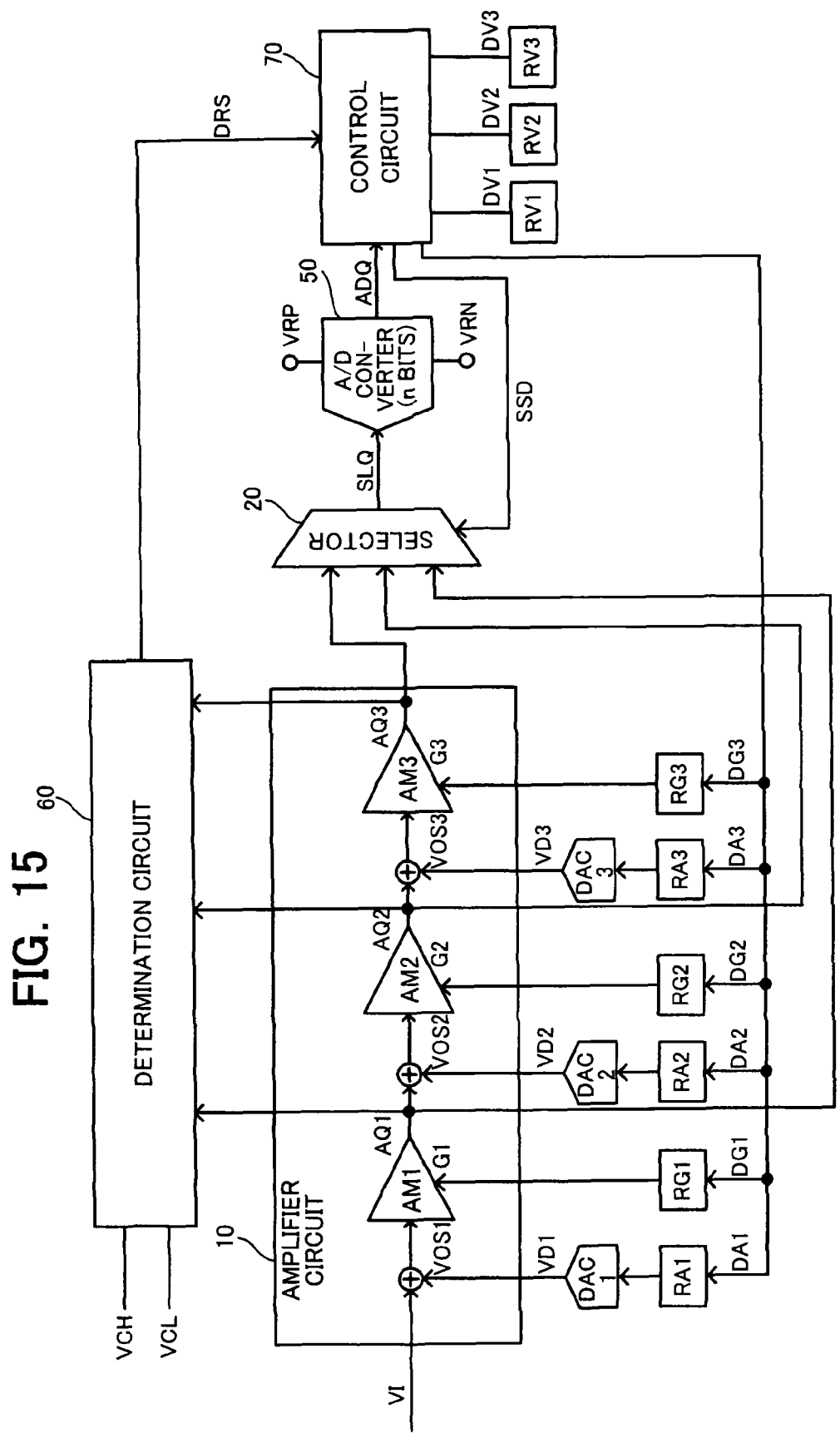
FIG. 15 shows a second modification of one embodiment of the invention.

FIG. 15 shows a second modification of this embodiment. In FIG. 15, a selector 20 and a determination circuit 60 are provided in addition to the elements shown in FIG. 1. A modification that combines FIG. 14 with FIG. 15 is also possible. In this case, the filter 38 may be provided between the selector 20 and the A/D converter 50, and the digital filter 100 may be provided in the control circuit 70, for example. Note that a modification in which only the determination circuit 60 is provided in FIG. 15 without providing the selector 20 is also possible.

The selector 20 (multiplexer) selects one of the output signals AQ1 to AQ3 (first to Nth output signals) from the amplifiers AM1 to AMN (first to Nth amplifiers). The selector 20 outputs the selected output signal as a selector output signal SLQ. Specifically, the selector 20 selects one of the output signals AQ1 to AQ3 based on a select instruction signal SSD output from the control circuit 70, and outputs the selected output signal. The selector 20 may include a plurality of logic gates, a plurality of transfer transistors, and the like. The A/D converter 50 performs an A/D conversion process on the selector output signal SLQ from the selector 20.

The determination circuit 60 (comparison circuit) performs a determination process (voltage comparison process) on the output signals AQ1 to AQ3 from the amplifiers AM1 to AM3 of the amplifier circuit 10. Specifically, the determination circuit 60 determines (compares) whether or not the voltage of the output signal from each of the amplifiers AM1 to AM3 is within a determination voltage range. The determination circuit 60 outputs a determination result signal DRS (e.g., error signal) to the control circuit 70. The determination voltage range is specified by a high-potential-side determination voltage VCH and a low-potential-side determination voltage VCL, for example.

The high-potential-side determination voltage VCH may be set at a voltage equal to or lower than the high-potential-side reference voltage VRP that specifies the input voltage range of the A/D converter 50 (VCH≦VRP), for example. The low-potential-side determination voltage VCL may be set at a voltage equal to or higher than the low-potential-side reference voltage VRN that specifies the input voltage range of the A/D converter 50 (VCL≧VRN). For example, the voltage range specified by the high-potential-side determination voltage VCH and the low-potential-side determination voltage VCL may be narrower than the voltage range specified by the high-potential-side reference voltage VRP and the low-potential-side reference voltage VRN by a margin (e.g., 10 to 90%).

The determination circuit 60 may include a plurality of comparators that compare the voltages of the output signals AQ1 to AQ3 from the amplifiers AM1 to AM3 with the high-potential-side determination voltage VCH and the low-potential-side determination voltage VCL. In this case, each comparator may be a comparator that has a hysteresis function. Alternatively, a circuit that holds the peak voltage of the output signals AQ1 to AQ3 may be provided, and the peak voltage may be compared with the determination voltages VCH and VCL using a comparator or the like.

The control circuit 70 instructs the selector 20 to select one of the output signals AQ1 to AQ3 from the amplifiers AM1 to AM3 based on the determination result of the determination circuit 60. For example, the control circuit 70 receives the determination result signal DRS from the determination circuit 60, generates the select instruction signal SSD, and outputs the select instruction signal SSD to the selector 20. More specifically, when the determination circuit 60 has determined that the voltage of the output signal from the jth amplifier (e.g., the amplifier AM3) among the amplifiers AM1 to AM3 is not within the determination voltage range specified by the high-potential-side determination voltage VCH and the low-potential-side determination voltage VCL, the control circuit 70 instructs the selector 20 to select the output signal from the (j−1)th amplifier (e.g., the amplifier AM2) in the preceding stage of the jth amplifier. When the determination circuit 60 has determined that the voltage of the signal input to the jth amplifier (e.g., the amplifier AM3) among the amplifiers AM1 to AM3 is not within a determination voltage range (jth determination voltage range) that is set corresponding to the gain of the jth amplifier, the control circuit 70 may instruct the selector 20 to select the output signal from the (j−1)th amplifier (e.g., the amplifier AM2) in the preceding stage of the jth amplifier.

According to the second modification shown in FIG. 15, when the voltage of the output signal AQ3 from the amplifier AM3 has exceeded the determination voltage range specified by the high-potential-side determination voltage VCH and the low-potential-side determination voltage VCL, for example, the output signal AQ2 from the amplifier AM2 in the preceding stage of the amplifier AM3 is selected by the selector 20, and is subjected to A/D conversion by the A/D converter 50. When the voltage of the output signal AQ2 from the amplifier AM2 has exceeded the determination voltage range specified by the high-potential-side determination voltage VCH and the low-potential-side determination voltage VCL, the output signal AQ1 from the amplifier AM1 in the preceding stage of the amplifier AM2 is selected by the selector 20, and is subjected to A/D conversion by the A/D converter 50. According to this configuration, even if the input signal VI that varies in amplitude and the like is input, a signal within an optimum voltage range is input to the A/D converter 50. Therefore, the dynamic range of the A/D converter 50 can be increased.

According to the second modification, an output signal within a voltage range close to the input voltage range (VRP to VRN) of the A/D converter 50 is selected by the selector 20, input to the A/D converter 50, and subjected to A/D conversion. Therefore, even if the amplitude of the input signal VI has changed (see A3 and A4 in FIG. 3), the A/D input amplitude (swing level) can be made almost constant (see A5). Therefore, the dynamic range DR can be increased without changing the A/D conversion resolution (e.g., 10 bits).

According to the second modification, an output signal having an appropriate amplitude is automatically selected from the output signals AQ1 to AQ3 from the amplifiers AM1 to AM3, and is input to the A/D converter 50. Therefore, the user can connect the sensor to the integrated circuit device without taking much account of the amplitude and the like of the detection signal. Therefore, a user-friendly integrated circuit device can be provided. Moreover, since it is unnecessary to produce a new integrated circuit device by way of trial corresponding to the type of sensor, the development cost can be reduced.

In the automatic adjustment method according to the second modification, since an automatic adjustment time lag occurs due to only the determination period of the determination circuit 60 and the select period of the selector 20, it is possible to quickly deal with a change in signal and the like and make a real-time automatic adjustment. Therefore, a dynamic range automatic adjustment method that is optimum for a signal (AC signal such as a sound signal) that requires a quick automatic adjustment, a detection signal that can be sampled only once (hard disk drive fall detection), and the like can be provided.

The control circuit 70 may set the gains under the second gain condition based on the determination result of the determination circuit 60. Specifically, the control circuit 70 determines the gains under the second gain condition (see FIG. 7C) utilizing the determination result of the determination circuit 60.

For example, the default gains under the second gain condition are referred to as G1=GC1, G2=GC2, and (G3=GC3. For example, GC1=32, GC2=8, and GC3=4. When the determination circuit 60 has determined that the voltages of the signals AQ1 to AQ3 are within the determination voltage range specified by the high-potential-side determination voltage VCH and the low-potential-side determination voltage VCL, the control circuit 70 employs the default gains under the second gain condition (e.g., G1=GC1=32, G2=GC2=8, and G3=GC3=2).

When the determination circuit 60 has determined that the voltages of the signals AQ1 and AQ2 are within the determination voltage range specified by the high-potential-side determination voltage VCH and the low-potential-side determination voltage VCL and the voltage of the signal AQ3 is not within the determination voltage range specified by the high-potential-side determination voltage VCH and the low-potential-side determination voltage VCL, the control circuit 70 reduces the gain G3 (e.g., G3=1). Specifically, the control circuit 70 sets the gains so that G1=GC1=32, G2=GC2=8, and G3=1.

When the determination circuit 60 has determined that the voltage of the signal AQ1 is within the determination voltage range specified by the high-potential-side determination voltage VCH and the low-potential-side determination voltage VCL and the voltages of the signals AQ2 and AQ3 are not within the determination voltage range specified by the high-potential-side determination voltage VCH and the low-potential-side determination voltage VCL, the control circuit 70 reduces the gains G2 and G3 (e.g., G2=4 and G3=1). Specifically, the control circuit 70 sets the gains so that G1=GC1=32, G2=4, and G3=1.

When the determination circuit 60 has determined that the voltages of the signals AQ1, AQ2, and AQ3 are not within the determination voltage range specified by the high-potential-side determination voltage VCH and the low-potential-side determination voltage VCL, the control circuit 70 reduces the gains G1, G2, and 63 (e.g., G1=16, G2=4, and G3=1).

After reducing the gains, the determination circuit 60 again determines whether or not the voltages of the signals AQ1 to AQ3 are within the determination voltage range. When the determination circuit 60 has determined that the voltages of the signals AQ1 to AQ3 are not within the determination voltage range, the above-described process may be repeated.

Figure 16:
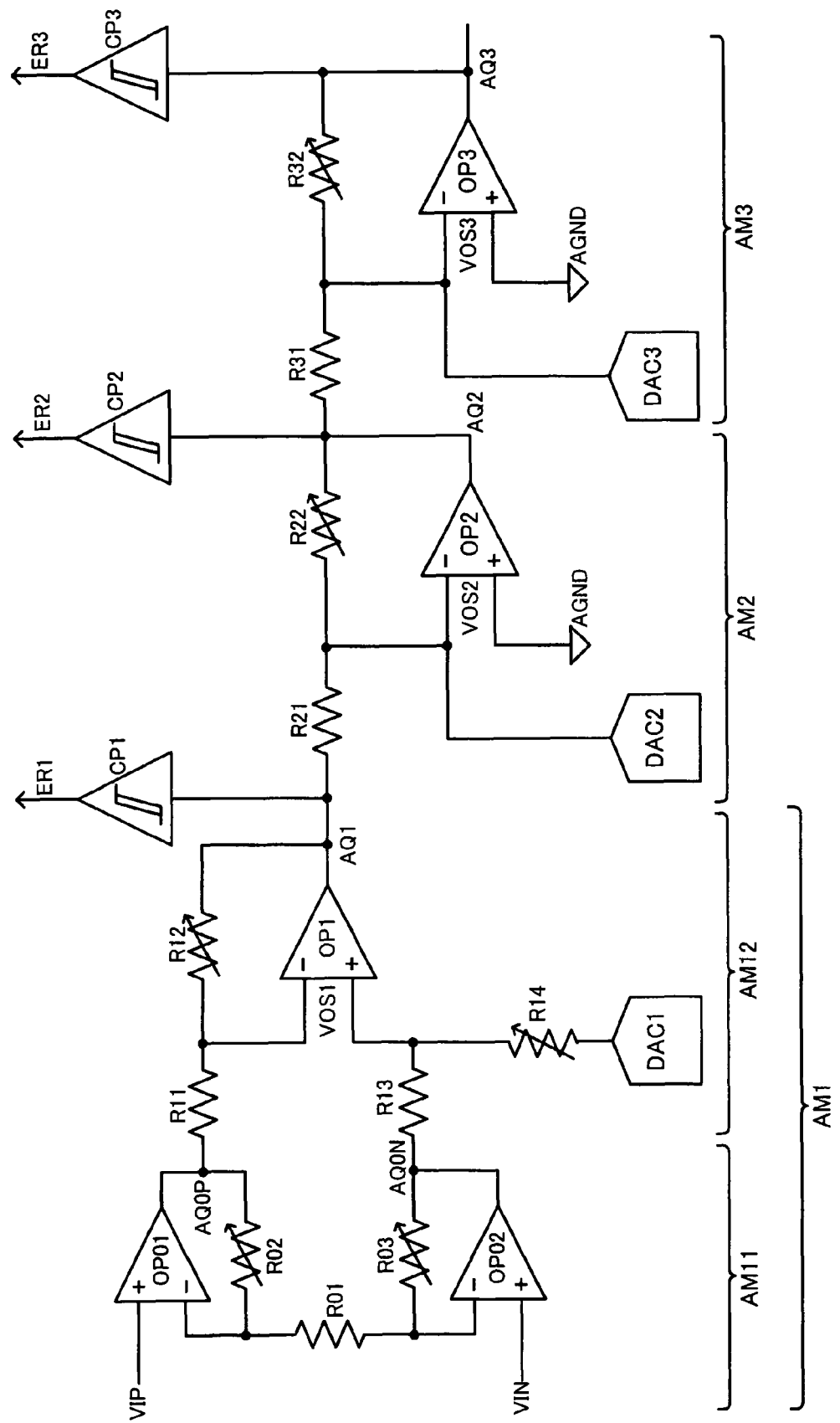
FIG. 16 shows a specific circuit configuration example of an amplifier circuit and a determination circuit.

FIG. 16 shows a specific circuit configuration example of the amplifier circuit 10 and the determination circuit 60. The amplifier AM1 includes amplifiers AM11 and AM12. The amplifier AM11 includes operational amplifiers OP01 and OP02 and resistors R01, R02, and R03. The resistors R02 and R03 are variable resistors, for example. The amplifier AM12 includes an operational amplifier OP1 and resistors R11, R12, R13, and R14. The resistors R12 and R14 are variable resistors, for example. The amplifiers AM11 and AM12 form an instrumentation amplifier that utilizes the operational amplifiers OP01, OP02, and OP1. The instrumentation amplifier is a differential-input/single-ended output balanced-input amplifier. The instrumentation amplifier is characterized in that the common mode rejection ratio (CMRR) can be increased. A sensor that outputs differential detection signals and a sensor that outputs a single-ended detection signal can be connected to the first-stage differential amplifier by utilizing the instrumentation amplifier as the first-stage differential amplifier For example, when connecting a sensor that outputs differential detection signals to the first-stage differential amplifier, a first signal (positive) that forms the differential detection signals is input as the signal VIP, and a second signal (negative) that forms the differential detection signals is input as the signal VIN. When connecting a sensor that outputs a single-ended detection signal to the first-stage differential amplifier, the single-ended detection signal is input as the signal VIP, and a VIN terminal is set at a reference analog voltage AGND, for example.

The amplifier AM2 includes an operational amplifier OP2 and resistors R21 and R22. The resistor 122 is a variable resistor, for example. The gain G2 of the amplifier AM2 is adjusted using the resistor R22. The amplifier AM3 includes an operational amplifier OP3 and resistors R31 and R32. The resistor R32 is a variable resistor, for example. The gain G3 of the amplifier AM3 is adjusted using the resistor R32. The amplifiers AM2 and AM3 are inverting amplifiers.

Specifically, the output terminal of the operational amplifier OP2 is connected to the output node of the inverting amplifier AM2. The first resistor R21 is provided between the inverting input terminal (first input terminal in a broad sense) of the operational amplifier OP2 and the input node of the inverting amplifier AM2. The second resistor R22 is provided between the output node of the inverting amplifier AM2 and the inverting input terminal of the operational amplifier OP2. The non-inverting input terminal (second input terminal in a broad sense) of the operational amplifier OP2 is set at the analog reference power supply voltage AGND, for example. The configuration of the inverting amplifier AM3 is the same as the configuration of the inverting amplifier AM2.

It is unnecessary to use rail-to-rail operational amplifiers as the operational amplifiers OP2 and OP3 of the amplifiers AM2 and AM3 by utilizing the inverting amplifiers as the amplifiers AM2 and AM3. For example, when utilizing non-inverting amplifiers as the amplifiers AM2 and AM3, a signal having a large amplitude is distorted. It is necessary to use a rail-to-rail operational amplifier in order to prevent such a problem. However, a rail-to-rail operational amplifier has a disadvantage in that the circuit scale of the operational amplifier increases and it is difficult to improve the characteristics of the operational amplifier. The above-mentioned problems can be solved by utilizing the inverting amplifiers as the amplifiers AM2 and AM3.

In FIG. 16, the D/A converters DAC1, DAC2, and DAC3 that adjust the offset voltages VOS1, VOS2, and VOS3 of the operational amplifiers OP1, OP2, and OP3 and the DC offset of the input signal are provided.

In FIG. 16, a plurality of comparators (comparison circuits) CP1, CP2, and CP3 are provided as the determination circuit 60. The comparators CP1, CP2, and CP3 respectively compare the output signals AQ1, AQ2, and AQ3 from the amplifiers AM1 (AM11 and AM12), AM2, and AM3 with the high-potential-side determination voltage VCH and the low-potential-side determination voltage VCL. The comparators CP1, CP2, and CP3 determine whether or not the voltages of the output signals AQ1, AQ2, and AQ3 are within the determination voltage range specified by the high-potential-side determination voltage VCH and the low-potential-side determination voltage VCL. When the comparators CP1, CP2, and CP3 have determined that the voltages of the output signals AQ1, AQ2, and AQ3 are not within the determination voltage range, the comparators CP1, CP2, and CP3 respectively activate error signals ER1, ER2, and ER3 (signal DRS) that indicate the determination result. For example, when the voltages of the output signals AQ1, AQ2, and AQ3 are outside the determination voltage range, the comparators CP1, CP2, and CP3 respectively activate the signals ER1, ER2, and ER3. Each of the comparators CP1 to CP3 may include a first comparator that compares the voltage of the output signal with the determination voltage VCH, and a second comparator that compares the voltage of the output signal with the determination voltage VCL.

It is desirable that each of the comparators CP1 to CP3 have a hysteresis function. For example, when the voltage (peak voltage) of one of the signals AQ1 to AQ3 is close to the determination voltage VCH or VCL, a situation in which the signals ER1, ER2, and ER3 are alternately set at the H level and the L level occurs. This causes malfunction of the circuit. Such a situation can be prevented by providing the comparators CP1 to CP3 with a hysteresis function (hysteresis characteristics using two threshold voltages). Note that a peak-hold circuit that holds the peak voltage of the output signals AQ1 to AQ3 may be provided instead of a hysteresis type comparator.

7. Electronic Instrument

An electronic instrument according to one embodiment of the invention is described below with reference to FIGS. 17A to 17C. Note that the electronic instrument according to this embodiment is not limited to the configurations shown in FIGS. 17A to 17C. Various modifications may be made such as omitting some of the elements or adding other elements.

Figure 17A:
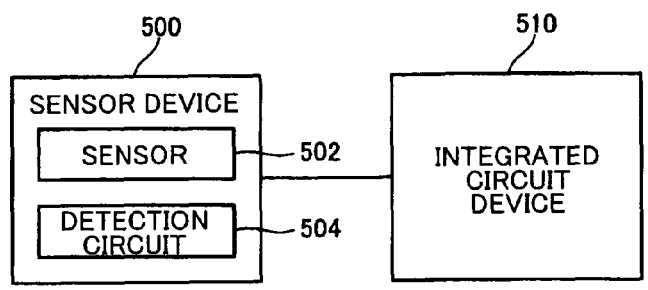
FIGS. 17A to 17C show configuration examples of an electronic instrument according to one embodiment of the invention.

FIG. 17A shows a first configuration example of the electronic instrument according to this embodiment. The electronic instrument according to the first configuration example includes a sensor device 500, and an integrated circuit device 510 (analog front-end (AFE) circuit) according to the above embodiment. In the electronic instrument shown in FIG. 17A, the sensor device 500 (physical quantity transducer) detects various physical quantities (e.g., force, acceleration, and mass). The sensor device 500 converts the physical quantity into a current (charge), a voltage, or the like, and outputs the current, voltage, or the like as a detection signal. The sensor device 500 includes a sensor 502 and a detection circuit 504. Note that the sensor device 500 may not include the detection circuit 504.

The integrated circuit device 510 receives the detection signal from the sensor device 500, subjects the detection signal to A/D conversion, and optionally performs a calculation process (signal processing) on digital data obtained by A/D conversion. The integrated circuit device 510 outputs the resulting digital data to a system (system board or system device such as a CPU) in the subsequent stage.

According to the first configuration example shown in FIG. 17A, various electronic instruments that include a smoke sensor, an optical sensor, a human detection sensor, a pressure sensor, a biosensor, a gyrosensor, and the like can be implemented.

Figure 17B:
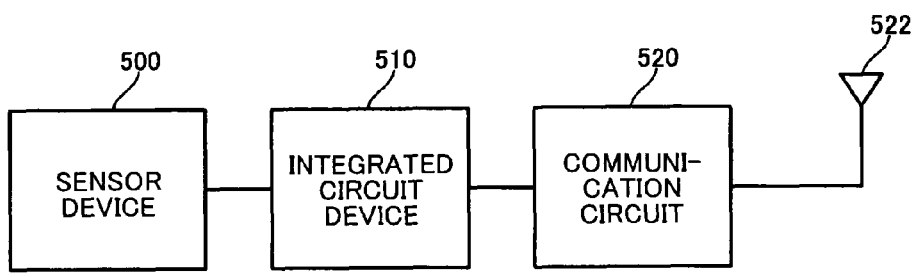

FIG. 17B shows a second configuration example of the electronic instrument according to this embodiment. In the second configuration example, a communication circuit (radio circuit) 520 and an antenna 522 are provided in addition to the elements of the first configuration example shown in FIG. 17A. The communication circuit 520 performs a modulation process and the like on the digital data from the integrated circuit device 510, and transmits the resulting data to an external instrument (target-side electronic instrument) using the antenna 522. The communication circuit 520 may receive data from an external instrument using the antenna 522, and perform an ID authentication process or control the sensor device 500, for example.

According to the second configuration example shown in FIG. 17B, electronic instruments such as an IC tag (RF tag) used for radio frequency identification (RFID) that writes and reads data in a contactless manner utilizing wireless communication can be implemented in addition to the electronic instruments that can be implemented by the first configuration example shown in FIG. 17A, for example.

Figure 17C:
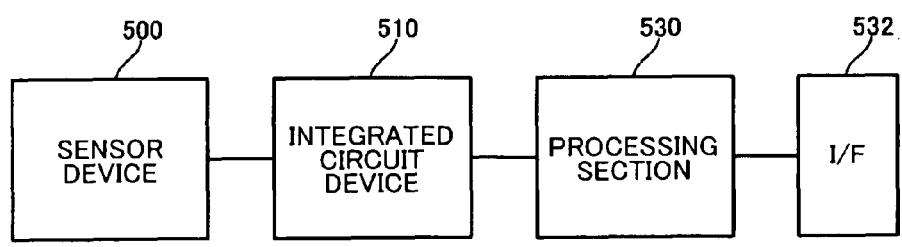

FIG. 17C shows a third configuration example of the electronic instrument according to this embodiment. The electronic instrument shown in FIG. 17C includes a processing section 530 and an interface (I/F) 532 in addition to the elements of the first configuration example shown in FIG. 17A. The processing section 530 receives the digital data from the integrated circuit device 510, and performs various processes. The I/F 532 performs data transfer conforming to the USB standard, the IEEE 1394 standard, or the like to and from an external instrument such as a personal computer (PC).

According to the third configuration example shown in FIG. 17C, electronic instruments such as an evaluation device (evaluation board) used for development and trial production of the sensor device 500 can be implemented in addition to the electronic instruments that can be implemented by the first and second configuration examples shown in FIGS. 17A and 17B.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g., amplifiers AM1 to AM3 and D/A converters DAC1 to DAC3) cited with a different term (e.g., first to Nth amplifiers and first to Nth D/A converters) having a broader meaning or the same meaning at least once in the specification and the drawings may be replaced by the different term in any place in the specification and the drawings. The configurations and the operations of the integrated circuit device and the electronic instrument are not limited to those described with reference to the above embodiments. Various modifications and variations may be made.

What is claimed is:

1. An integrated circuit device comprising:
    an amplifier circuit that includes first to Nth (N is an integer equal to or larger than two) amplifiers and receives an input signal, the first to Nth amplifiers being cascaded;
    an A/D converter that performs an A/D conversion process on a signal amplified by the amplifier circuit;
    first to Nth offset adjustment registers that are provided corresponding to the first to Nth amplifiers and store first to Nth offset adjustment data, the first to Nth offset adjustment data being used to perform an offset adjustment of the first to Nth amplifiers;
    first to Nth D/A converters that are provided corresponding to the first to Nth amplifiers and used to perform an offset adjustment based on the first to Nth offset adjustment data;
    first to Nth offset value storage sections that store first to Nth offset value data, the first to Nth offset value data being offset value data of the first to Nth amplifiers; and
    a control circuit that calculates the first to Nth offset adjustment data based on the first to Nth offset value data stored in the first to Nth offset value storage sections, and sets the first to Nth offset adjustment data in the first to Nth offset adjustment registers.

2. The integrated circuit device as defined in claim 1, further comprising:

first to Nth gain adjustment registers that are provided corresponding to the first to Nth amplifiers and store first to Nth gain adjustment data, the first to Nth gain adjustment data being used to perform a gain adjustment of the first to Nth amplifiers.

3. The integrated circuit device as defined in claim 1, the control circuit calculating the first to Nth offset value data based on digital data from the A/D converter and gains of the first to Nth amplifiers, and setting the first to Nth offset value data in the first to Nth offset value storage sections when performing amplifier offset calibration of the first to Nth amplifiers.

4. The integrated circuit device as defined in claim 1, the control circuit performing jth (j is an integer that satisfies $1<j\leq N$) offset calibration that measures an offset voltage of a jth amplifier among the first to Nth amplifiers, then performing (j−1)th offset calibration that measures an offset voltage of a (j−1)th amplifier among the first to Nth amplifiers that is provided in a preceding stage of the jth amplifier when performing amplifier offset calibration of the first to Nth amplifiers.

5. The integrated circuit device as defined in claim 1, the control circuit performing jth (j is an integer that satisfies $1<j\leq N$) offset calibration that measures an offset voltage of a jth amplifier among the first to Nth amplifiers, during the jth offset calibration the control circuit calculating a jth offset value data among the first to Nth offset value data based on digital data from the A/D converter and a gain of the jth amplifier, and setting the jth offset value data in a jth offset value storage section among the first to Nth offset value storage sections, and the control circuit performing (j−1)th offset calibration that measures an offset voltage of a (j−1)th amplifier among the first to Nth amplifiers, during the (j−1)th offset calibration the control circuit calculating the jth offset adjustment data based on the jth offset value data, setting the jth offset adjustment data in the jth offset adjustment register, calculating a (j−1)th offset value data among the first to Nth offset value data based on the digital data from the A/D converter, a gain of the (j−1)th amplifier, and the gain of the jth amplifier, and setting the (j−1)th offset value data in a (j−1)th offset value storage section among the first to Nth offset value storage sections.

6. The integrated circuit device as defined in claim 5, the control circuit setting the gain of the (j−1)th amplifier and the gain of the jth amplifier so that the gain of the (j−1)th amplifier is higher than the gain of the jth amplifier when performing the (j−1)th offset calibration.

7. The integrated circuit device as defined in claim 5, the control circuit performing (j−2)th offset calibration that measures an offset voltage of a (j−2)th amplifier among the first to Nth amplifiers, during the (j−2)th offset calibration the control circuit calculating (j−1)th offset adjustment data among the first to Nth offset adjustment data based on the (j−1)th offset value data, setting the (j−1)th offset adjustment data in a (j−1)th offset adjustment register among the first to Nth offset adjustment registers, calculating jth offset adjustment data among the first to Nth offset adjustment data based on the (j−1)th offset value data and the jth offset value data, setting the jth offset adjustment data in a jth offset adjustment register among the first to Nth offset adjustment registers, calculating (j−2)th offset value data among the first to Nth offset value data based on the digital data from the A/D converter, a gain of the (j−2)th amplifier, the gain of the (j−1)th amplifier, and the gain of the jth amplifier, and setting the (j−2)th offset value data in a (j−2)th offset value storage section among the first to Nth offset value storage sections.

8. The integrated circuit device as defined in claim 7, the control circuit calculating the jth offset adjustment data based on a rounding error value, the gain of the (j−1)th amplifier, and the jth offset value data, and setting the jth offset adjustment data in the jth offset adjustment register when performing the (j−2)th offset calibration, the rounding error value being due to a rounding calculation process that calculates the (j−1)th offset adjustment data based on the (j−1)th offset value data.

9. The integrated circuit device as defined in claim 1, the control circuit calculating the first to Nth offset adjustment data based on the first to Nth offset value data stored in the first to Nth offset value storage sections, and setting the first to Nth offset adjustment data in the first to Nth offset adjustment registers when performing signal offset calibration of the input signal.

10. The integrated circuit device as defined in claim 9, the control circuit calculating ith (i is an integer that satisfies $1\leq i<N$) offset adjustment data among the first to Nth offset adjustment data, setting the ith offset adjustment data in an ith offset adjustment register among the first to Nth offset adjustment registers, calculating (i+1)th offset adjustment data among the first to Nth offset adjustment data, and setting the (i+1)th offset adjustment data in an (i+1)th offset adjustment register among the first to Nth offset adjustment registers when performing the signal offset calibration.

11. The integrated circuit device as defined in claim 9, the control circuit calculating ith (i is an integer that satisfies $1\leq i<N$) offset adjustment data based on ith offset value data among the first to Nth offset value data, setting the ith offset adjustment data in an ith offset adjustment register among the first to Nth offset adjustment registers, the control circuit calculating (i+1)th offset adjustment data among the first to Nth offset adjustment data based on the ith offset value data, (i+1)th offset value data among the first to Nth offset value data, and a gain of an ith amplifier among the first to Nth amplifiers, and setting (i+1)th offset adjustment data in an (i+1)th offset adjustment register among the first to Nth offset adjustment registers.

12. The integrated circuit device as defined in claim 11, the control circuit calculating the (i+1)th offset adjustment data based on a rounding error value, the gain of the ith amplifier, and the (i+1)th offset value data, and setting the (i+1)th offset adjustment data in the (i+1)th offset adjustment register, the rounding error value being due to a rounding calculation process that calculates the ith offset adjustment data based on the ith offset value data.

13. The integrated circuit device as defined in claim 9, the control circuit calculating signal offset value data of the input signal based on digital data from the A/D converter and gains of the first to Nth amplifiers after the first to Nth offset adjustment data has been set in the first to Nth offset adjustment registers.

14. The integrated circuit device as defined in claim 13, the control circuit setting the gains of the first to Nth amplifiers at gains under a first gain condition, and calculating signal offset value data of the input signal, the control circuit setting the gains of the first to Nth amplifiers at gains under a second gain condition, and again calculating the signal offset value data of the input signal, the gains under the second gain condition being set to be higher than the gains under the first gain condition.

15. The integrated circuit device as defined in claim 14, further comprising:

a determination circuit that determines whether or not a voltage of an output signal from each of the first to Nth amplifiers is within a determination voltage range specified by a high-potential-side determination voltage and a low-potential-side determination voltage, the control circuit setting the gains under the second gain condition based on a determination result of the determination circuit.

16. An electronic instrument comprising the integrated circuit device as defined in claim 1.

* * * * *